(12) United States Patent
Kojima et al.

(10) Patent No.: US 6,639,354 B1
(45) Date of Patent: Oct. 28, 2003

(54) LIGHT EMITTING DEVICE, PRODUCTION METHOD THEREOF, AND LIGHT EMITTING APPARATUS AND DISPLAY UNIT USING THE SAME

(75) Inventors: Shigeru Kojima, Kanagawa (JP); Katsuya Shirai, Kanagawa (JP); Yoshifumi Mori, Chiba (JP); Atsushi Toda, Kanagawa (JP)

(73) Assignee: Sony Corporation, Tokyo (JP)

( * ) Notice: Subject to any disclaimer, the term of this patent is extended or adjusted under 35 U.S.C. 154(b) by 395 days.

(21) Appl. No.: 09/621,656

(22) Filed: Jul. 21, 2000

(30) Foreign Application Priority Data

Jul. 23, 1999 (JP) .......................... P11-209383

(51) Int. Cl.[7] .......................... H05B 33/00; H05B 33/14
(52) U.S. Cl. .................. 313/498; 313/503; 313/502; 313/509; 313/506; 257/86; 257/87; 257/94; 257/100; 257/103; 438/46; 438/47; 438/99
(58) Field of Search .................. 257/86, 87, 90, 257/94, 96, 97, 103, 100; 438/46, 47, 99; 313/498, 499, 503, 502, 506, 509

(56) References Cited

U.S. PATENT DOCUMENTS

| | | | | |
|---|---|---|---|---|
| 4,748,132 A | * | 5/1988 | Fukuzawa et al. | 438/45 |
| 5,059,001 A | * | 10/1991 | Shimizu | 257/21 |
| 5,371,379 A | * | 12/1994 | Narusawa | 257/14 |
| 5,608,229 A | * | 3/1997 | Mukai et al. | 257/14 |
| 5,629,231 A | * | 5/1997 | Kiehl | 438/509 |
| 6,157,047 A | * | 12/2000 | Fujita et al. | 257/51 |

* cited by examiner

Primary Examiner—Ashok Patel
Assistant Examiner—Mariceli Santiago
(74) Attorney, Agent, or Firm—Sonnenschein, Nath & Rosenthal LLP

(57) ABSTRACT

An n-type cladding layer formed of a non-single crystal body of n-type AlGaN, a light emitting layer containing a plurality of micro-crystals made from ZnO, and a p-type cladding layer formed of a non-single crystal body of p-type BN are sequentially stacked on a substrate made from quartz glass. An insulating layer is formed between the n-type cladding layer and the p-type cladding layer in such a manner as to bury spaces between the micro-crystals, to thereby prevent occurrence of leakage current. The insulating layer is formed by oxidizing the surface of the n-type cladding layer. Since the light emitting layer contains the plurality of micro-crystals improved in crystallinity, it is possible to enhance the emission efficiency, to extend the selection range of each of materials for forming the light emitting layer, n-type cladding layer, p-type cladding layer, and substrate, and to form a device array on a common substrate having a large area.

16 Claims, 24 Drawing Sheets

F I G. 6
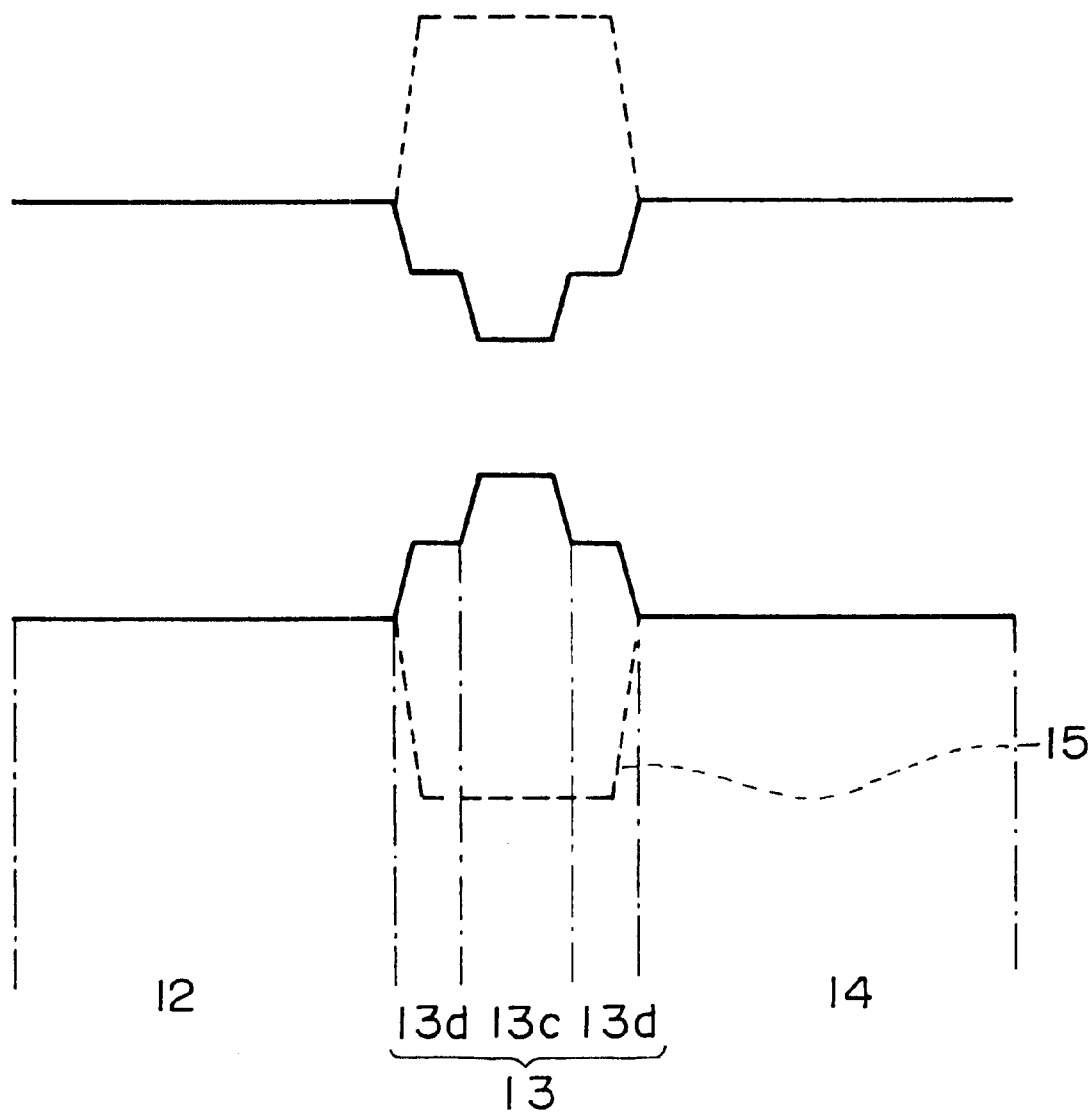

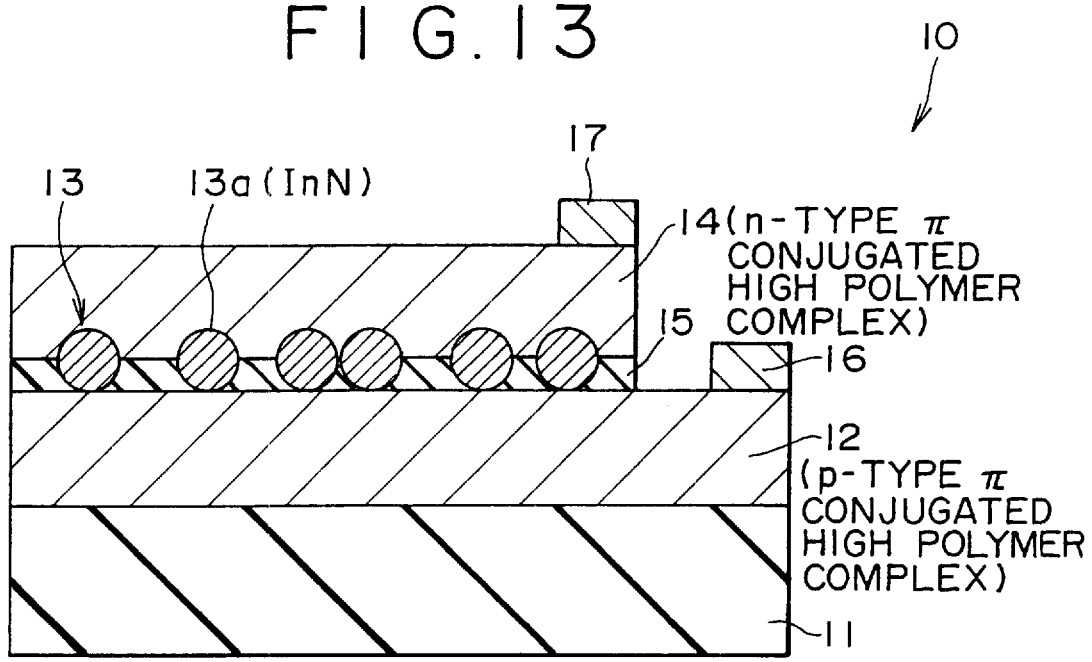
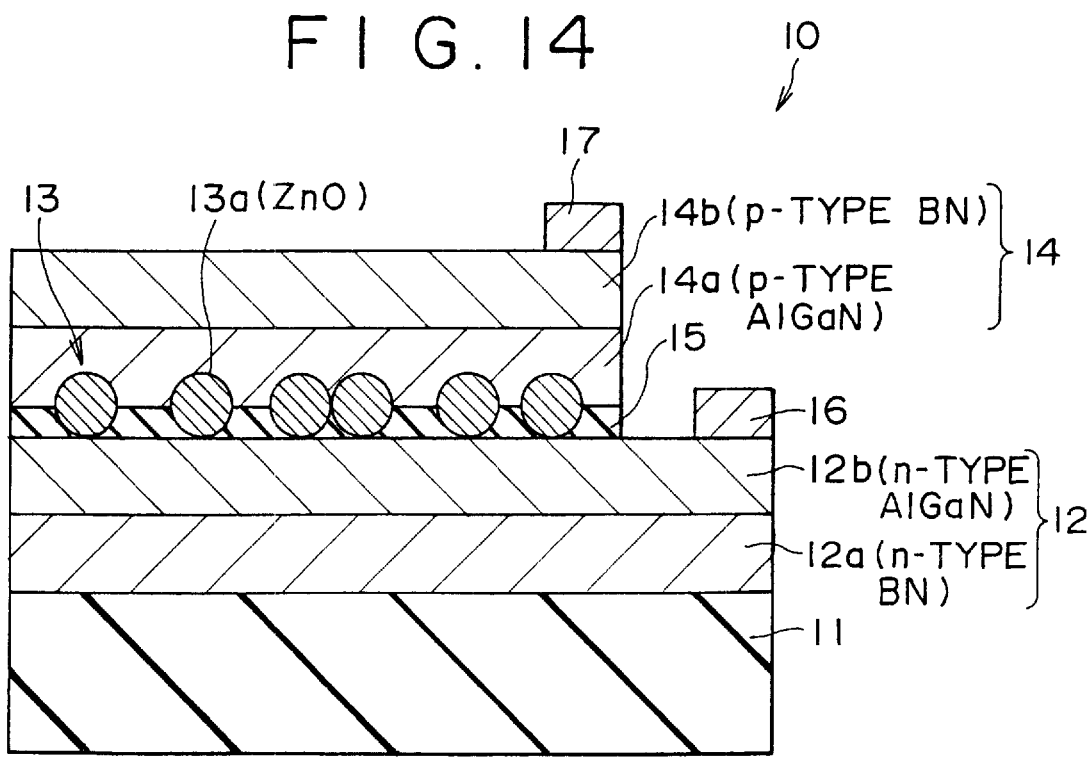

F I G. 18
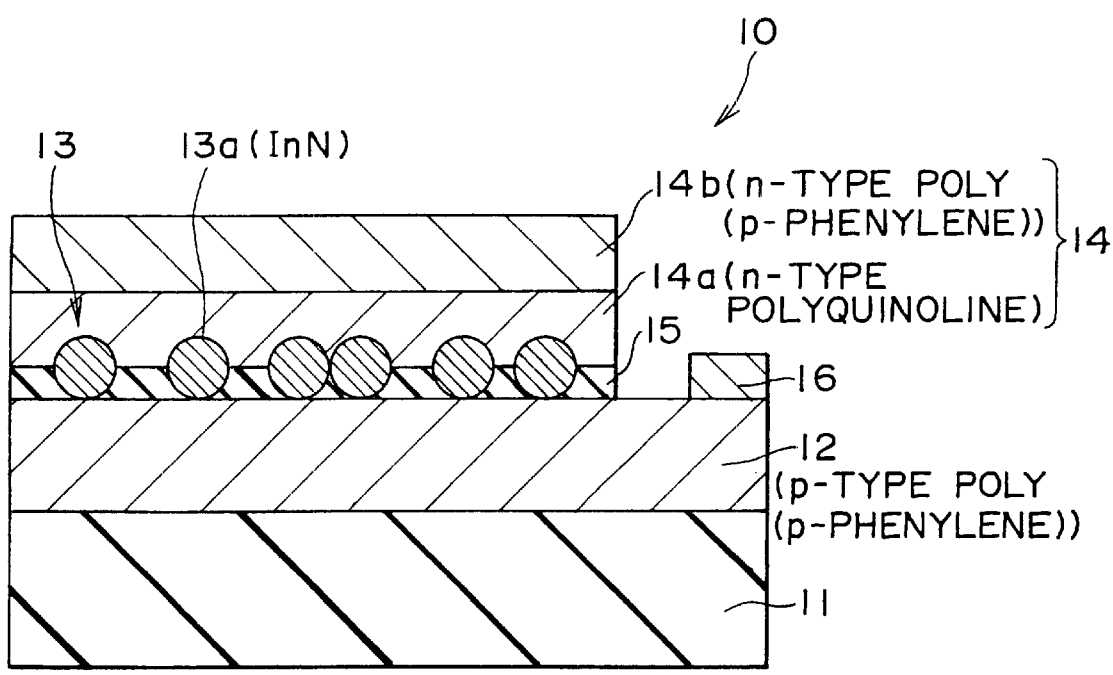

LIGHT EMITTING DEVICE, PRODUCTION METHOD THEREOF, AND LIGHT EMITTING APPARATUS AND DISPLAY UNIT USING THE SAME

BACKGROUND OF THE INVENTION

The present invention relates to a light emitting device using micro-crystals, a production method thereof, and a light emitting apparatus and a display unit using the light emitting device.

Light emitting devices using semiconductors such as GaAs, GaAsP mixed crystal, GaAlAs mixed crystal, and GaP have been developed. Such a light emitting device has a structure in which an n-type semiconductor layer, a light emitting layer, and a p-type semiconductor layer are sequentially stacked on a substrate. When a voltage bias is applied to the light emitting device in the forward direction, electrons are recombined with positive holes in the light emitting layer, to thereby generate light emission. In accordance with a related art production method, each of the n-type semiconductor layer, light emitting layer, and p-type semiconductor layer has been composed of a single crystal body formed on the substrate by epitaxial growth. Accordingly, the substrate has also been formed of a single crystal body.

In a method of producing such a related art light emitting device in which each of the n-type semiconductor layer, light emitting layer, and p-type semiconductor layer is composed of a single crystal body, the alignment in lattice or alignment in crystal structure between the layer and the substrate is essential to ensure a good crystallinity of the layer; and the epitaxial growth condition is severely limited and the epitaxial growth must be performed at a high temperature to reduce occurrence of defects, with a result that the kind of material for the substrate is significantly limited, that is, the degree of freedom in selection of the material for the substrate becomes small. Accordingly, the related art light emitting device causes a problem in which since quarts or glass cannot be used for a substrate, it is impossible to produce a device array formed on a common substrate having a large area.

The materials for forming the light emitting material, n-type semiconductor layer, and p-type semiconductor layer are also significantly limited by the material of the substrate, and the degree of freedom in selection of the materials for forming the above layers is small. This causes a problem that the wavelength of light emission is limited. Further, although various attempts have been made to reduce defects as described above, it is impossible to perfectly eliminate the defects. Since the remaining defects act as non-luminescence centers, there occurs a problem that the emission efficiency is reduced and the performance of the light emitting device is degraded.

SUMMARY OF THE INVENTION

An object of the present invention is to provide a light emitting device capable of enhancing the emission efficiency, extending the selection range of materials, and forming a device array on a common substrate having a large area; a production method thereof; and a light emitting apparatus and a display unit using the light emitting device.

To achieve the above object, according to a first aspect of the present invention, there is provided a light emitting device including: a first conductive type layer; a second conductive type layer; and a micro-crystal layer containing a plurality of micro-crystals made from a semiconductor, the micro-crystal layer being formed between the first conductive type layer and the second conductive type layer. With this configuration, since the micro-crystal layer is composed of a plurality of the micro-crystals with few defects, the crystallinity of the micro-crystal layer can be improved, to thereby enhance the emission efficiency and prolong the service life. Since it is not required to take into account the lattice alignment with the substrate, it is possible to select a suitable material in accordance with the desired emission wavelength and the like. Since the band gap of the micro-crystal layer becomes wider as the grain size of each micro-crystal becomes smaller by the particle size effect, it is possible to shorten the wavelength of light emission. For example, it is possible to obtain light emission in an ultraviolet region by using the micro-crystals made from ZnO. The light emitting device allowing light emission in the ultraviolet region can be used as a light source for a germicidal lamp. Further, since each of the first conductive type layer and the second conductive type layer is not required to be formed of a single crystal body, the selection range of the material for each of the layers can be extended, and since each of the first conductive type layer and the second conductive type layer can be formed of a non-single crystal body of an inorganic semiconductor, an organic semiconductor, or a conductive resin, it can be easily formed at a low temperature.

In the above light emitting device, the micro-crystal layer may contain two kinds or more of micro-crystals made from different semiconductors. With this configuration, there can be obtained an effect of obtaining a plurality of kinds of light emission having different wavelengths.

In the above light emitting device, the micro-crystal layer may contain micro-crystals each having a layer-structure. With this configuration, there can be obtained an effect of further enhancing the emission efficiency.

In the above light emitting device, at least one of the first conductive type layer and the second conductive type layer may be made from a non-single crystal body, or at least one of an organic semiconductor and a conductive resin. With this configuration, there can be obtained an effect of easily forming at least one of the first conductive type layer and the second conductive type layer at a low temperature.

In the above light emitting device, at least one of the first conductive type layer and the second conductive type layer may have a plurality of layers which are stacked in such a manner that a band gap of the conductive type layer becomes smaller at a portion nearer to the micro-crystal layer. With this configuration, there can be obtained an effect of further enhancing the emission efficiency.

In the above light emitting device, at least one of the first conductive type layer and the second conductive type layer may have an adhesive layer. With this configuration, there can be obtained an effect of enhancing the adhesiveness of an electrode.

In the above light emitting device, at least one of the first conductive type layer and the second conductive type layer may have an electrode layer. With this configuration, there can be obtained an effect of eliminating the need of newly forming an electrode made from a metal or a metal alloy, and thereby simplifying the device structure and the production steps.

In the above light emitting device, an insulating layer for preventing the contact between the first conductive type layer and the second conductive type layer may be formed in spaces between the micro-crystals of the micro-crystal layer. With this configuration, it is possible to reduce leakage current between the first conductive type layer and the second conductive type layer, accordingly electrons and positive holes can be efficiently injected in the micro-crystals. As a result, there can be obtained an effect of improving the emission efficiency.

In the above light emitting device, the substrate may be made from an amorphous material or a plastic material. With this configuration, there can be obtained an effect of easily enlarging the area of the substrate, thereby forming a device array on a common substrate having a large area.

In the above light emitting device, the substrate may be made from a metal, a semiconductor, or silicon carbide. With this configuration, there can be obtained an effect of uniformly applying a voltage over the entire micro-crystal layer, thereby uniformly generating light emission from the entire surface of the micro-crystal layer, and further simplifying the production steps. Also, there can be obtained an effect of easily enlarging the area of the substrate, thereby forming a device array on a common substrate having a large area.

In the above light emitting device, a diffusion preventive layer may be formed between the first conductive type layer and the second conductive type layer. With this configuration, there can be obtained an effect of preventing the diffusion of components between the substrate and the first conductive layer, thereby improving the quality of the light emitting device.

In the above light emitting device, an auxiliary electrode may be formed between the first conductive type layer and the substrate. With this configuration, there can be obtained an effect of uniformly applying a voltage over the entire micro-crystal layer, thereby uniformly generating light emission from the entire surface of the micro-crystal layer.

The above light emitting device may further include a phosphor layer. With this configuration, there can be obtained an effect of easily changing colors of light emission by changing phosphor materials for forming the phosphor layer, and hence to extend the selection range of the phosphor materials and extend the range of colors of light emission.

According to a second aspect of the present invention, there is provided a light emitting device including: a first conductive type cladding layer; a second conductive type cladding layer; and a light emitting layer containing a plurality of micro-crystals, the light emitting layer being formed between the first conductive type cladding layer and the second conductive type cladding layer. With this configuration, there can be obtained the same effects as the corresponding effects obtained by the light emitting device according to the first aspect of the present invention. Further, in this light emitting device, an insulating layer is provided between the first conductive type cladding layer and the second conductive type cladding layer. With this configuration, there can be obtained the same effects as the corresponding effects of the light emitting device according to the first aspect of the present invention.

According to a third aspect of the present invention, there is provided a method of producing a light emitting device, including the steps of: forming a first conductive type layer; forming a micro-crystal layer containing a plurality of micro-crystals made from a semiconductor on the first conductive type layer; and forming a second conductive type layer on the first conductive type layer via the micro-crystal layer. With this configuration, there can be obtained an effect of easily producing the light emitting device of the present invention, thereby easily realizing the light emitting device of the present invention.

In the above production method, the formation of a micro-crystal layer may be followed by a heating treatment in an oxygen containing atmosphere, a nitrogen containing atmosphere, or hydrogen containing atmosphere. With this configuration, there can be obtained an effect of improving the crystallinity of the micro-crystals.

In the above production method, at least one of the first conductive type layer and the second conductive type layer may be made from a non-single crystal body of an inorganic semiconductor, or at least one of an organic semiconductor and a conductive resin. With this configuration, there can be obtained an effect of easily forming at least one of the first conductive type layer and the second conductive type layer at a low temperature.

In the above production method, after formation of a first conductive type layer, the surface of the first conductive type layer may be oxidized or nitrided. With this configuration, there can be obtained an effect of easily forming an insulating film, thereby easily realizing the light emitting device of the present invention.

According to a fourth aspect of the present invention, there is provided a method of producing a light emitting device, including the steps of: forming a first conductive type cladding layer; forming a light emitting layer; forming an insulating layer; and forming a second conductive type cladding layer. With this configuration, there can be obtained an effect of easily producing the light emitting device of the present invention, thereby easily realizing the light emitting device of the present invention.

According to a fifth aspect of the present invention, there is provided a light emitting apparatus including: a plurality of light emitting devices stacked to each other. With this configuration, there can be obtained an effect of making pixels finer as compared with a light emitting apparatus in which a plurality of light emitting devices allowing light emission of different colors are disposed on a plane, thereby obtaining a high precision color display unit.

According to a sixth aspect of the present invention, there is provided a display unit including the light emitting device of the present invention. With this configuration, there can be obtained an effect of using a substrate made from an amorphous material such as glass, a plastic material, or a metal, thereby disposing a device array on a common substrate having a large area.

BRIEF DESCRIPTION OF THE DRAWINGS

FIG. 6 is a diagram showing a band gap structure of the light emitting diode shown in FIG. 5;

FIG. 13 is a sectional view showing a configuration of a light emitting diode according to a tenth embodiment of the light emitting device of the present invention;

FIG. 14 is a sectional view showing a configuration of a light emitting diode according to an eleventh embodiment of the light emitting device of the present invention;

FIG. 18 is a sectional view showing a configuration of a light emitting diode according to a fourteenth embodiment of the light emitting device of the present invention;

DETAILED DESCRIPTION OF THE PREFERRED EMBODIMENTS

Hereinafter, preferred embodiments of the present invention will be described with reference to the accompanying drawings.

First Embodiment of Light Emitting Device

Figure 1:
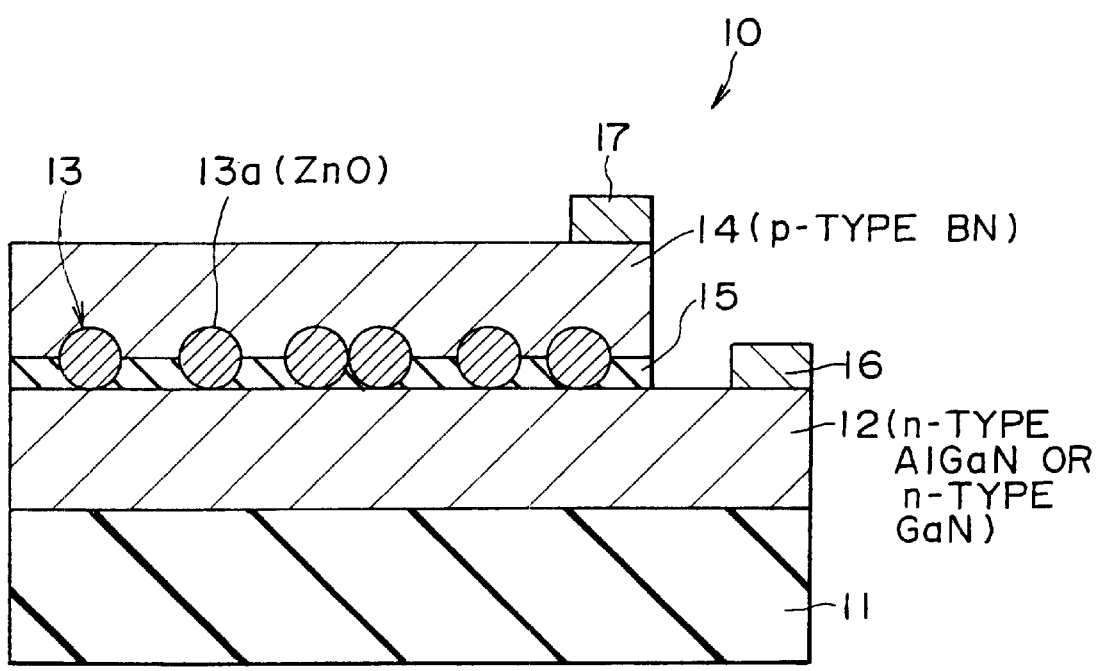
FIG. 1 is a sectional view showing a configuration of a light emitting diode according to a first embodiment of a light emitting device of the present invention.

FIG. 1 shows a sectional structure of a light emitting diode (LED) 10 according to a first embodiment of a light emitting device of the present invention. The light emitting diode 10 is formed by sequentially stacking, on one plane of a substrate 11, a first conductive type cladding layer 12 as a first conductive type layer, a light emitting layer 13 as a micro-crystal layer, and a second conductive type cladding layer 14 as a second conductive type layer. In this embodiment, the first conductive type is an n-type, and the second conductive type is a p-type.

The substrate 11 has a thickness in the stacking direction (hereinafter, referred to simply as "thickness") of 0.5 mm, and is made from a transparent material, for example, glass such as quartz glass or silicate glass, crystalline quartz, or sapphire. The substrate 11 made from such a transparent material is advantageous in that it allows light to emerge from the substrate 11 side. The material of the substrate 11 is not limited to a transparent material but may be an amorphous material other than glass. The use of an amorphous material as the material for forming the substrate 11 is advantageous in easily enlarging the area of the substrate 11.

The first conductive type cladding layer 12 has a thickness of 1 $\mu$m, and is made from n-type AlGaN or n-type GaN doped with an n-type impurity such as silicon (Si). In addition, the n-type AlGaN or n-type GaN is used as the material for forming the cladding layer 12 in the form of a non-single crystal body, for example, a polycrystalline body, an amorphous body, or a mixture thereof. The content of aluminum in the above n-type AlGaN is in a range of 50 mol % or less.

The light emitting layer 13 contains a plurality of micro-crystals 13a made from ZnO. Here, the term "micro-crystals" means micro-particles having a single crystal structure or a polycrystalline structure, which allow light emission. The grain size of each micro-crystal 13a (that is, grain size of one single crystal) is preferably in a range of 100 nm or less in order to obtain crystals with no defects. The micro-crystals 13a of nearly one layer are formed in the stacking direction.

The second conductive type cladding layer 14 has a thickness of 0.5 $\mu$m, and is formed of a non-single crystal body of p-type BN doped with a p-type impurity such as magnesium (Mg) or a non-single crystal body of p-type AlN doped with a p-type impurity such as zinc (Zn). In this way, according to this embodiment, each of the first conductive type cladding layer 12 and the second conductive type cladding layer 14 is made from the inorganic semiconductor containing nitrogen (N), and the light emitting layer 13 is made from the inorganic semiconductor containing oxygen (O).

An insulating layer 15 is formed between the first conductive type cladding layer 12 and the second conductive type cladding layer 14 in such a manner as to bury spaces between the micro-crystals 13a of the light emitting layer 13 for preventing the contact between the first conductive type cladding layer 12 and the second conductive type cladding layer 14. The insulating layer 15 has a thickness smaller than the grain size of each micro-crystal 13a of the light emitting layer 13, and is made from a compound of aluminum (Al), gallium (Ga) and oxygen (O), or a compound of gallium and oxygen.

A first electrode 16 is formed on the side, opposite to the substrate 11, of the first conductive type cladding layer 12. The first electrode 16 is formed by sequentially stacking a titanium (Ti) layer, an aluminum layer, a platinum (Pt) layer, and a gold (Au) layer on the first conductive type cladding layer 12 and alloying them by heating, and is thereby electrically connected to the first conductive type cladding layer 12. A second electrode 17 is formed on the side, opposite to the substrate 11, of the second conductive type cladding layer 14. The second electrode 17 is formed by sequentially stacking a nickel (Ni) layer, a platinum layer, and a gold layer on the second conductive type cladding layer 14 and alloying them by heating, and is thereby electrically connected to the second conductive type cladding layer 14. That is to say, the first electrode 16 functions as an n-side electrode, and the second electrode 17 functions as a p-side electrode.

Figure 2:
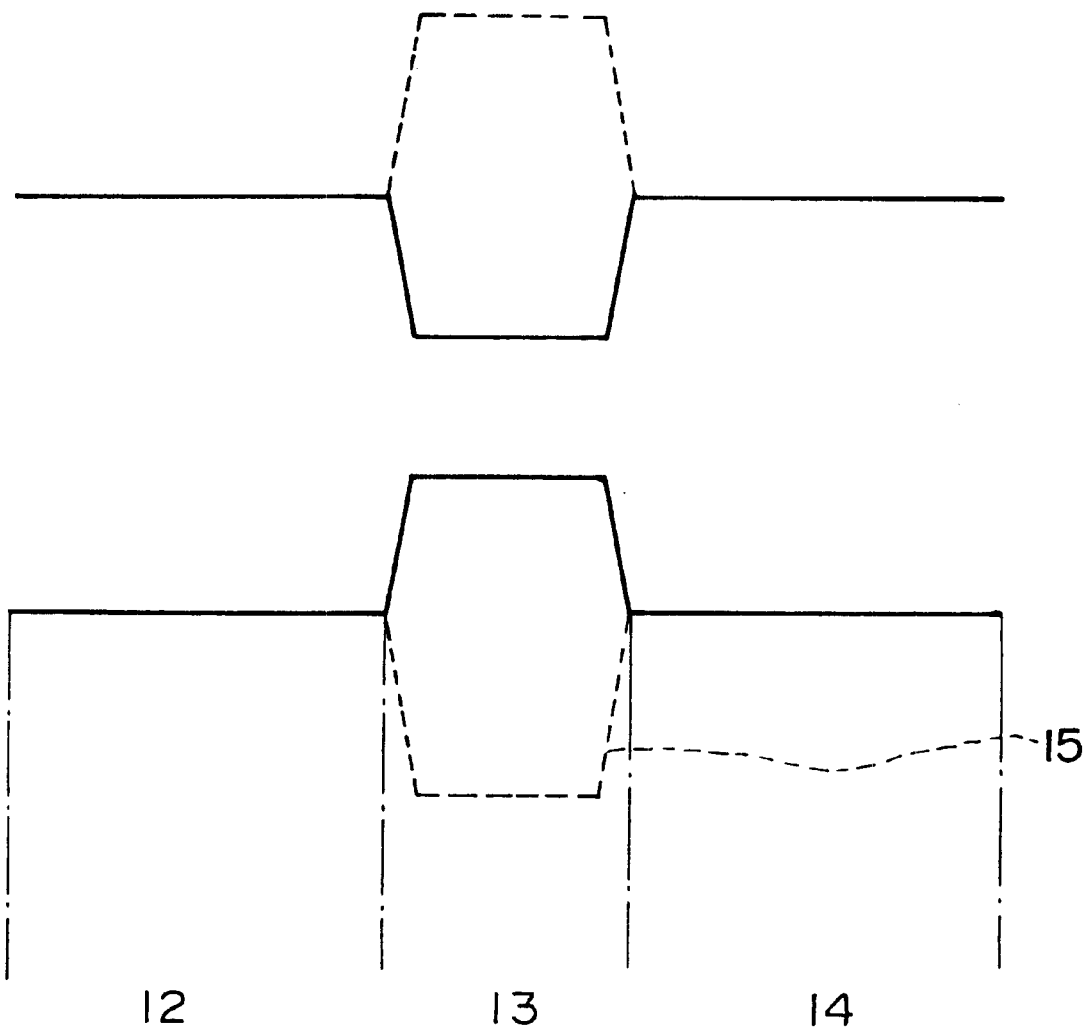
FIG. 2 is a diagram showing a band gap structure of the light emitting diode shown in FIG. 1.

FIG. 2 shows a band gap structure of the light emitting diode 10. In FIG. 2, a solid-line designates the band gaps of the first conductive type cladding layer 12, the light emitting layer 13, and the second conductive type cladding layer 14, and a broken line designates the band gap of the insulating layer 15. As shown in this figure, the band gap of the light emitting layer 13 is smaller than each of the band gaps of the first conductive type cladding layer 12 and the second conductive type cladding layer 14, and the band gap of the insulating layer 15 is larger than that of the light emitting layer 13. That is to say, between the second conductive type cladding layer 14 and the first conductive type cladding layer 12, a current flows via the light emitting layer 13.

The band gap of each of the first conductive type cladding layer 12, second conductive type cladding layer 14, the insulating layer 15 is determined by the material for forming the layer, and the band gap of the light emitting layer 13 (that is, micro-crystals 13a) is determined by the material for forming the micro-crystals 13a and the grain size thereof. In general, the smaller the grain size of each micro-crystal 13a, the wider the band gap of the light emitting layer 13. The emission wavelength of the light emitting diode 10 is determined by the band gap of the light emitting layer 13. In this embodiment, the band gap of the light emitting layer 13 is about 3.3 eV, and the emission wavelength is about 380 nm.

Figure 3A:
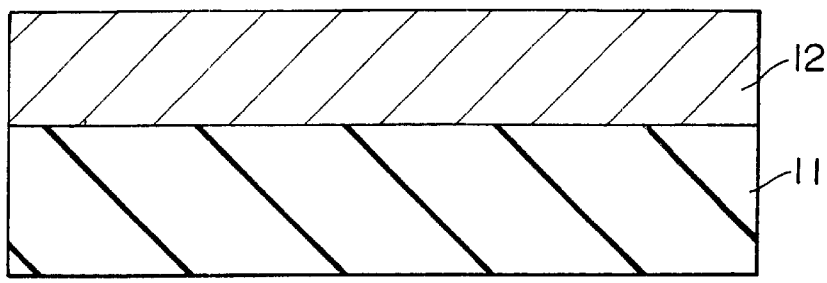
FIGS. 3A to 3D are sectional views showing sequential steps of producing the light emitting diode shown in FIG. 1.

The light emitting diode 10 configured as described above can be produced in accordance with the following procedure:

FIGS. 3A to 3D show sequential steps of producing the light emitting diode 10. Referring first to FIG. 3A, a substrate 11 made from quartz glass is prepared, and a first conductive cladding layer 12 formed of a non-single crystal body of n-type AlGaN or n-type GaN is formed on one plane of the substrate 11 by a sputtering process, a chemical vapor deposition (CVD) process, a molecular beam epitaxy (MBE) process, or a laser deposition process. At this step, the temperature of the substrate 11 is set at 600° C. or less. The reason for this is that since the first conductive type cladding layer 12 is formed of the non-single crystal body, the temperature of the substrate 11 is not required to be made so high. This means that if the substrate 11 is made from an amorphous material such as glass, such a material can sufficiently withstand the temperature at which the first conductive type cladding layer 12 is formed. Next, if the activation of an impurity doped in the first conductive type cladding layer 12 is insufficient, it is additionally performed by a laser annealing process.

Figure 3B:
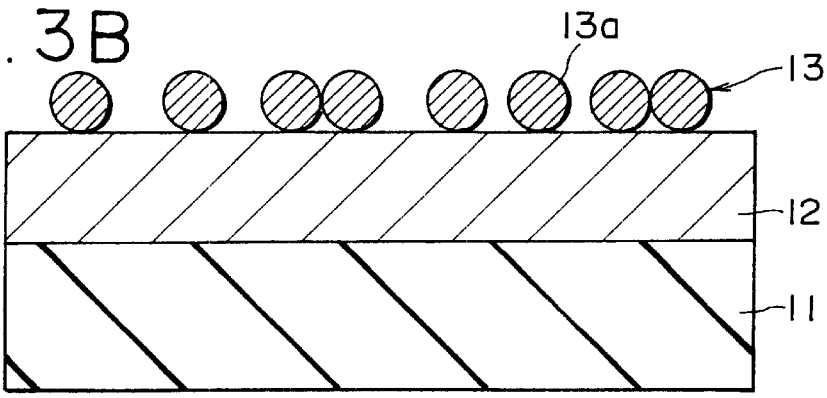

Referring to FIG. 3B, a light emitting layer 13 is formed on the side, opposite to the substrate 11, of the first conductive type cladding layer 12 by depositing a plurality of micro-crystals 13a made from ZnO on the layer 12 by an electrodeposition process, the MBE process, or the laser deposition process, or coating the layer 12 with a plurality of the micro-crystals 13a made from ZnO dispersed in a solvent. At this step, the grain size of each micro-crystal 13a, the covering ratio of the first conductive type cladding layer 12 with the micro-crystals 13a, and the stacked number of the micro-crystals 13a (that is, the thickness of the light emitting layer 13) are respectively controlled by adjusting the following conditions: namely, the purity and temperature of the solution, applying voltage, and treatment time for the electrochemical process; the temperature of the substrate 11, atmospheric gas pressure, and deposition rate for the MBE process or laser deposition process; and the kind, viscosity, and concentration of the solvent for the coating process.

Figure 3C:
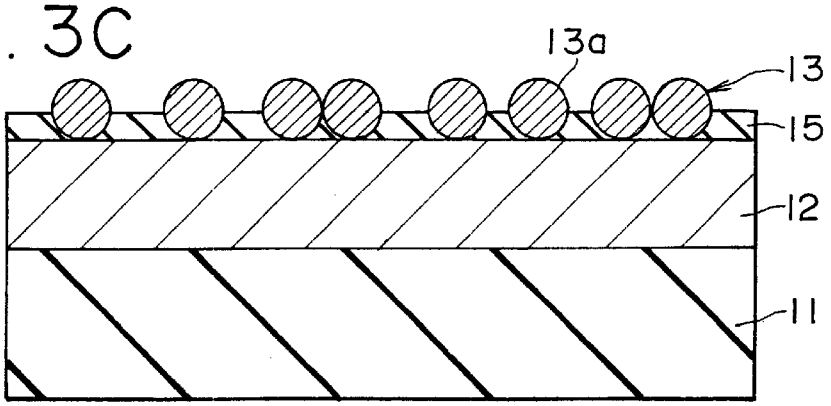

Referring to FIG. 3C, the formation of the light emitting layer 13 is followed by heating in an oxygen containing atmosphere, for example, oxygen plasma treatment. With this heating treatment, oxygen vacancies present in the micro-crystals 13a of the light emitting layer 13 are interpolated, to improve the crystallinity of the micro-crystals 13a, and further the surface of a portion, being not in contact with the micro-crystals 13a, of the first conductive type cladding layer 12 is oxidized, to form an insulating layer 15 made from a compound of aluminum, gallium, and oxygen, or a compound of gallium and oxygen. The heating treatment in the oxygen containing atmosphere is preferably followed by a heating treatment in a hydrogen containing atmosphere, for example, a hydrogen plasma treatment in order to further interpolate the oxygen vacancies remaining in the micro-crystals 13a of the light emitting layer 13, thereby further improving the crystallinity of the micro-crystals 13a. These heating treatments using oxygen and hydrogen make inactive the light emission of green (wavelength: 510 nm) due to donor-acceptor recombination concerned with donors formed by the oxygen vacancies [T. Sekiguchi et al.: Jpn. J. Appl. Phys., 36, L289 (1997)).

Figure 3D:
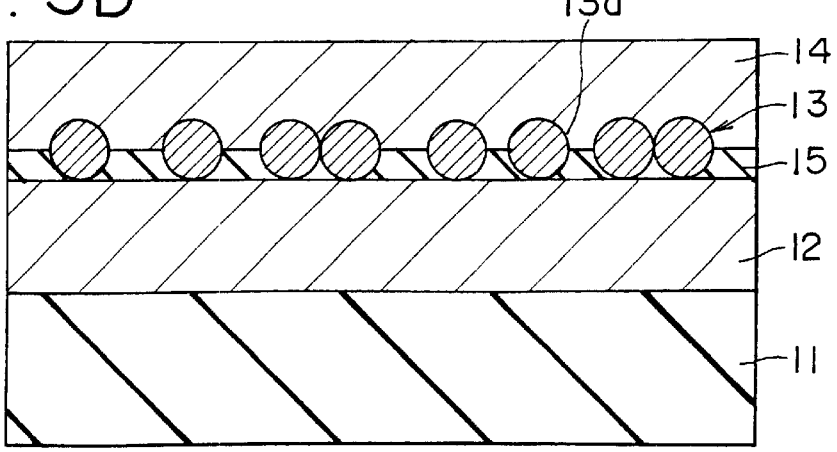

Referring to FIG. 3D, after the heating treatments in the oxygen containing atmosphere and the hydrogen containing atmosphere, a second conductive type cladding layer 14 formed of a non-single crystal body of p-type BN or p-type AlN is formed on the side, opposite to the substrate 11, of the first conductive type cladding layer 12 via the light emitting layer 13 and the insulating layer 15 by the sputtering process, CVD process, MBE process, or laser deposition process. At this step, the temperature of the substrate 11 is set at 600° C. or less. The reason for this is that since the second conductive type cladding layer 14 is also formed of the non-single crystal body, the temperature of the substrate 11 is not required to be made so high. This means that if the substrate 11 is made from an amorphous material such as glass, such a material can sufficiently withstand the temperature at which the second conductive type cladding layer 14 is formed. Next, if the activation of an impurity doped in the second conductive type cladding layer 14 is insufficient, it is additionally performed by the laser annealing process.

After the formation of the second conductive type cladding layer 14, the second conductive type cladding layer 14, light emitting layer 13, and insulating layer 15 are selectively removed in sequence by lithography and etching, to expose part of the first conductive type cladding layer 12 corresponding to a position at which a first electrode 16 is to be formed. At this step, part of the first conductive type cladding layer 12 may be selectively removed. After exposure of part of the first conductive type cladding layer 12, a resist film (not shown) is formed on both the second conductive type cladding layer 14 and the portion, exposed by etching, of the first conductive type cladding layer 12, and an opening is formed in the resist film at the position at which the first electrode 16 is to be formed. Then, a titanium layer, aluminum layer, platinum layer, and gold layer are sequentially vapor-deposited over the entire surface by a vacuum vapor-deposition process, and the resist film is removed together with the metal layers formed thereon by a lift-off process, to form a first electrode 16. Subsequently, like the formation of the first electrode 16, a second electrode 17 is selectively formed on the second conductive type cladding layer 14 by sequentially vapor-depositing a nickel layer, a platinum layer, and a gold layer. The resultant structure is then subjected to a heating treatment, to alloy the metals forming each of the second electrode 17 and the first electrode 16. In this way, the light emitting diode 10 shown in FIG. 1 is produced.

The function of the light emitting diode 10 thus produced will be described below.

In this light emitting diode 10, when a specific voltage is applied between the first electrode 16 and the second electrode 17, a current is injected in the micro-crystals 13a of the light emitting layer 13, to generate light emission due to electron-positive hole recombination at the micro-crystals 13a. Since the micro-crystals 13a have little defects, they can emit light at a high efficiency. The emission wavelength is determined by the band gap of the light emitting layer 13. In this embodiment, the emission wavelength is set at about 380 nm. Since the insulating layer 15 is formed between the second conductive type cladding layer 14 and the first conductive type cladding layer 12, a leakage current between the second conductive type cladding layer 14 and the first conductive type cladding layer 12 is reduced, with a result that the current efficiently flows through the micro-crystals 13a. That is to say, electrons and positive holes are efficiently injected in the micro-crystals 13a.

The light emitting device 10 is usable as a light source for an illuminating apparatus, a display unit, or a germicidal lamp.

In this way, according to the light emitting diode 10 of this embodiment, since the light emitting layer 13 is composed of a plurality of the micro-crystals 13a, the crystallinity of the light emitting layer 13 can be improved, to thereby enhance the emission efficiency and prolong the service life. Since it is not required to take into account the lattice alignment with the substrate 11, it is possible to select a suitable material in accordance with the desired emission wavelength and the like. Since the band gap of the light emitting layer 13 becomes wider as the grain size of each micro-crystal 13a becomes smaller by the particle size effect, it is possible to shorten the wavelength of light emission. For example, it is possible to obtain light emission in an ultraviolet region by using the micro-crystals 13a made from ZnO. The light emitting diode 10 allowing light emission in the ultraviolet region can be used as a light source for a germicidal lamp.

The light emitting diode 10 is also advantageous in that since each of the first conductive type cladding layer 12 and the second conductive type cladding layer 14 is not required to be formed of a single crystal body, the selection range of the material for forming each of the cladding layers 12 and 14 can be extended. For example, each of the cladding layers 12 and 14 can be formed of a non-single crystal body at a low temperature. This means that the selection range of the material for forming the substrate 11 can be extended. To be more specific, the substrate 11 can be made from an amorphous material such as glass. The use of an amorphous material as the material for forming the substrate 11 allows the formation of a device array on the common substrate 11 having a large area.

A further advantage of the light emitting diode 10 is that since the insulating layer 15 is provided to bury spaces between the micro-crystals 13a of the light emitting layer 13, a leakage current between the second conductive type cladding layer 14 and the first conductive type cladding layer 12 is reduced, so that electrons and positive holes can be efficiently injected in the micro-crystals 13a. As a result, it is possible to improve the emission efficiency.

According to the method of producing the light emitting diode 10 of this embodiment, since it includes the steps of sequentially stacking the first conductive type cladding layer 12 and the light emitting layer 13 on the substrate 11, forming the insulating layer 15, and forming the second conductive type cladding layer 14, the light emitting diode 10 having the above-described configuration can be easily produced. In particular, since the formation of the light emitting layer 13 is followed by the heating treatment in the oxygen containing atmosphere, the insulating layer 15 can be easily formed, and further the crystallinity of the micro-crystals 13a can be improved. According to this embodiment, since the heating treatment in the oxygen containing atmosphere is followed by the heating treatment in a hydrogen containing atmosphere, the crystallinity of the micro-crystals 13a can be further improved.

Second Embodiment of Light Emitting Device

Figure 4:
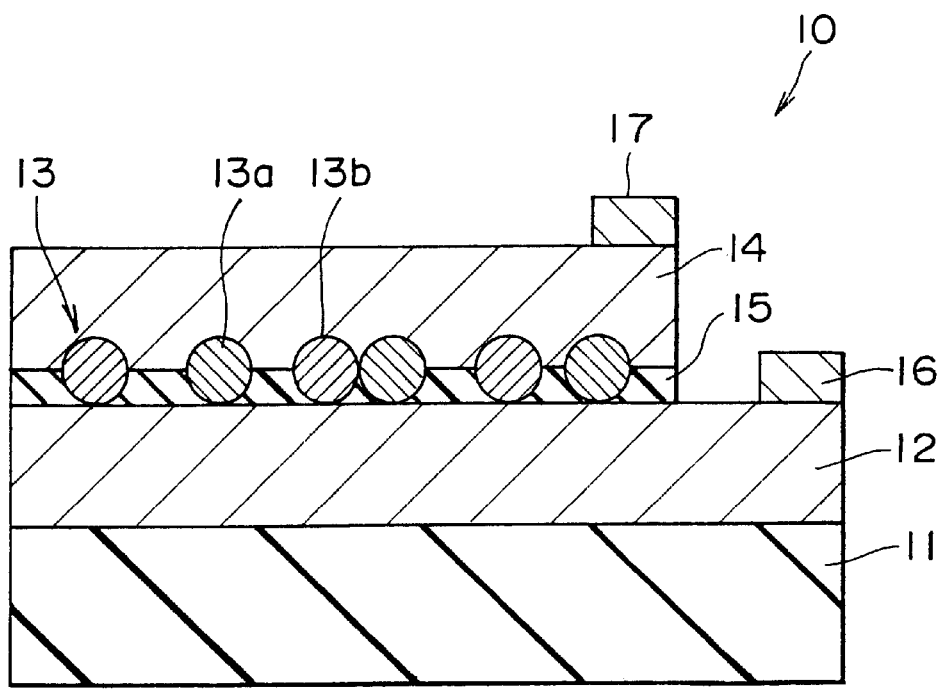
FIG. 4 is a sectional view showing a configuration of a light emitting diode according to a second embodiment of the light emitting device of the present invention.

FIG. 4 shows a sectional structure of a light emitting diode 10 according to a second embodiment of the light emitting device of the present invention. The light emitting diode 10 has the same structure as that of the light emitting diode of the first embodiment except for the configuration of a light emitting layer 13, and can be produced in the same manner as that described in the first embodiment and be used for the same applications as those described in the first embodiment. In this embodiment, parts corresponding to those of the first embodiment are designated by the same reference numerals, and the detailed description thereof is omitted.

The light emitting layer 13 contains a plurality of micro-crystals 13a made from ZnO and also a plurality of micro-crystals 13b made from $TiO_2$. To be more specific, the light emitting layer 13 contains the two kinds of micro-crystals 13a and 13b made from the different semiconductors, and has two band gaps. The band gap of the micro-crystals 13a made from ZnO is about 3.3 eV, and the band gap of the micro-crystals 13b is about 2.9 eV.

In this light emitting diode 10, when a specific voltage is applied to the first and second electrodes 16 and 17, a current is injected in the micro-crystals 13a and 13b of the light emitting layer 13, to generate light emission at both the micro-crystals 13a and 13b. Since the micro-crystals 13a and 13b are made from the different semiconductors, the band gaps thereof are different from each other. As a result, the micro-crystals 13a and 13b emit two kinds of light having different wavelengths, about 380 nm and about 430 nm, respectively. In addition, the micro-crystals 13b made from $TiO_2$ generate, when they cause the occurrence of a large shift in stokes, light emission having a wavelength of 530 nm at a low temperature [N. Hosaka et al.: J. Luminescence, 72–74, 874 (1997)].

In this way, according to this embodiment, in addition to the effects of the first embodiment, there can be obtained an effect that since the micro-crystals 13a and 13b of the light emitting layer 13 are made from the different semiconductors, the two kinds of light having different wavelengths can be obtained.

In this embodiment, description has been made of the example that the light emitting layer 13 contains the two kinds of micro-crystals 13a and 13b; however, the light emitting layer 13 may contain pluralities of three kinds or more of micro-crystals made from different semiconductors. Specific examples of the materials for forming the micro-crystals may include not only ZnO and $TiO_2$ but also ZnSe, CdS, CdSe, InN, GaAsP mixed crystal, and α-Sic. The number of emission-wavelengths of the light emitting diode 10 can be made larger by making the kinds of the micro-crystals constituting the light emitting layer 13 larger.

Third Embodiment of Light Emitting Device

Figure 5:
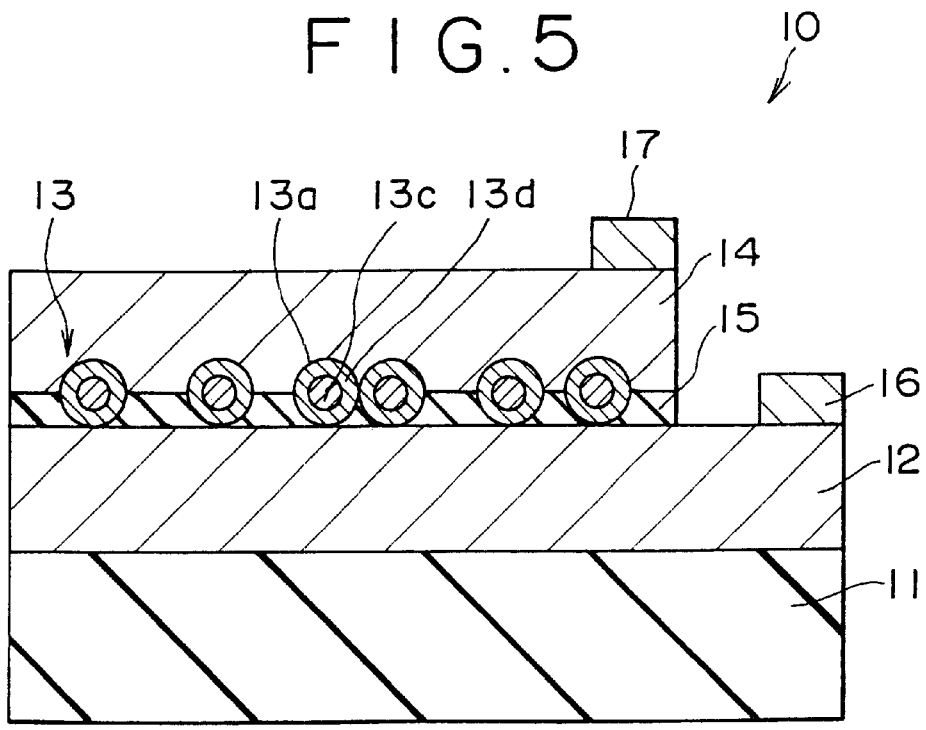
FIG. 5 is a sectional view showing a configuration of a light emitting diode according to a third embodiment of the light emitting device of the present invention.

FIG. 5 shows a sectional structure of a light emitting diode 10 according to a third embodiment of the light emitting device of the present invention. The light emitting diode 10 has the same structure as that of the light emitting diode of the first embodiment except for the configuration of a light emitting layer 13, and can be produced in the same manner as that described in the first embodiment and be used for the same applications as those described in the first embodiment. In this embodiment, parts corresponding to those of the first embodiment are designated by the same reference numerals, and the detailed description thereof is omitted.

The light emitting layer 13 contains a plurality of micro-crystals 13a each of which is of a double layer structure having an inner layer 13c and a surface layer 13d formed on the surface thereof. The inner layer 13c functions as a light emitting portion, and the surface layer 13d functions to enhance the emission efficiency of the inner layer 13c. The material for forming the surface layer 13d is selected such that the band gap of the surface layer 13d is larger than that of the inner layer 13c and is smaller than that of each of the first conductive type cladding layer 12 and the second conductive type cladding layer 14. To be more specific, the inner layer 13c is made from undoped ZnO, and the surface layer 13d is made from Mg-doped ZnO. The inner layer 13c may be made from undoped CdS, and the surface layer 13d be made from undoped ZnS.

FIG. 6 shows a band gap structure of the light emitting diode 10. In FIG. 6, a solid-line designates the band gaps of the first conductive type cladding layer 12, the light emitting layer 13, and the second conductive type cladding layer 14, and a broken line designates the band gap of the insulating layer 15. With respect to the band gap of the light emitting layer 13, the band gap of the inner layer 13c is smaller than that of the surface layer 13d. Like the first embodiment, the band gap of the light emitting layer 13 is smaller than that of each of the first conductive type cladding layer 12, the second conductive type cladding layer 14, and the insulating layer 15.

In this light emitting diode 10, when a specific voltage is applied between the first electrode 16 and the second electrode 17, a current is injected in the micro-crystals 13a of the light emitting layer 13, to generate light emission at the micro-crystals 13a. In this embodiment, since each of the micro-crystals 13a is composed of the inner layer 13c and the surface layer 13d, the band gap of the light emitting layer 13 is stepwise changed, so that the emission efficiency of the light emitting diode 10 is enhanced.

In this way, according to this embodiment, in addition to the effects of the first embodiment, there can be obtained an effect that since the light emitting layer 13 is formed of the micro-crystals 13a having the double layer structure, the emission efficiency can be further enhanced. It should be noted that this embodiment can also be applied to the above-described second embodiment.

Fourth Embodiment of Light Emitting Device

Figure 7:
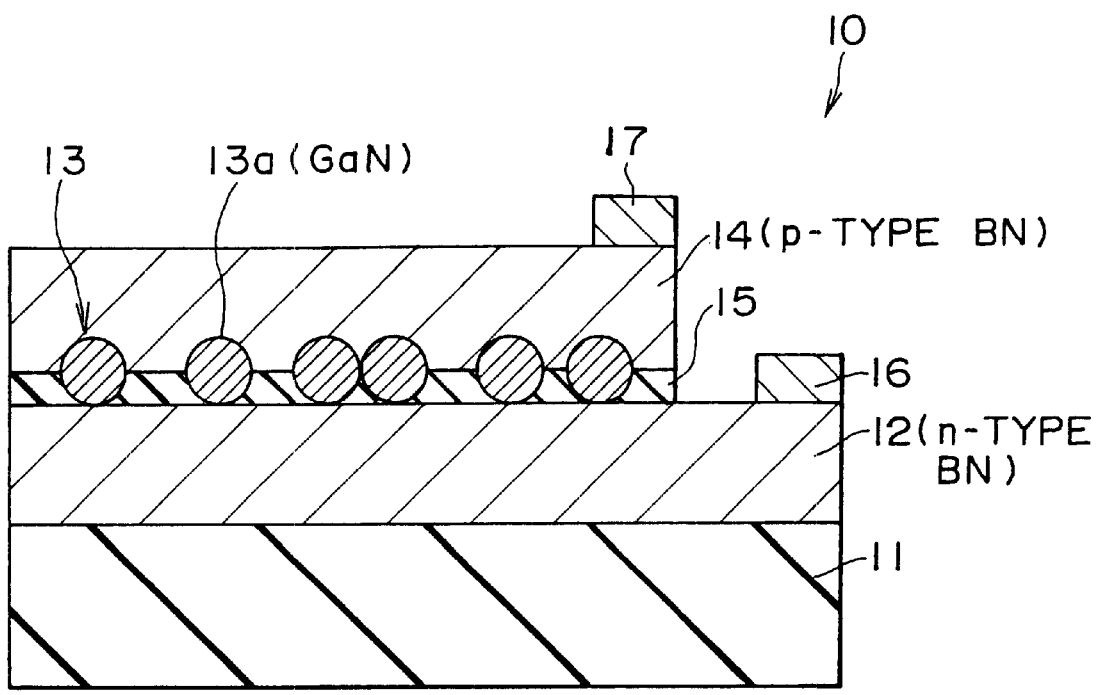
FIG. 7 is a sectional view showing a configuration of a light emitting diode according to a fourth embodiment of the light emitting device of the present invention.

FIG. 7 shows a sectional structure of a light emitting diode 10 according to a fourth embodiment of the light emitting device of the present invention. The light emitting diode 10 is one example different from that of the first embodiment in materials of a first conductive type cladding layer 12, a light emitting layer 13, a second conductive type cladding layer 14, an insulating layer 15, and a first electrode 16. In this embodiment, parts corresponding to those of the first embodiment are designated by the same reference numerals, and the detailed description thereof is omitted.

The first conductive type cladding layer 12 is formed of a non-single crystal body of n-type BN doped with an n-type impurity such as carbon (C). The light emitting layer 13 contains a plurality of micro-crystals 13a made from GaN. The second conductive type cladding layer 14 is formed of a non-single crystal body of p-type BN doped with a p-type impurity such as magnesium. The insulating layer 15 is made from a compound of boron (B) and oxygen. That is to say, according to this embodiment, each of the first conductive type cladding layer 12, light emitting layer 13, and second conductive type cladding layer 14 is made from the inorganic semiconductor containing nitrogen, and the first conductive type cladding layer 12 and the second conductive type cladding layer 14 are made from the semiconductor materials identical to each other except for the conductive type.

Even in this embodiment in which the first conductive type cladding layer 12, light emitting layer 13, second conductive type cladding layer 14, and insulating layer 15 are made from the above-described materials, the band gap of the light emitting layer 13 is, like the first embodiment, smaller than that of each of the first conductive type cladding layer 12, second conductive type cladding layer 14, and insulating layer 15.

The first electrode 16 has the same structure as that of the second electrode 17, which structure is obtained by sequentially stacking a nickel layer, a platinum layer, and a gold layer on the first conductive type cladding layer 12 and alloying them by heating.

The light emitting diode 10 configured as described above can be produced in accordance with the following procedure:

First, a substrate 11 is prepared, and a first conductive cladding layer 12 formed of a non-single crystal body of n-type BN is formed on one plane of the substrate 11 by the sputtering process or laser deposition process. At this step, like the first embodiment, the temperature of the substrate 11 is set at 600° C. or less. Like the first embodiment, if the activation of the impurity doped in the first conductive type cladding layer 12 is insufficient, it is additionally performed by the laser annealing process.

Subsequently, a plurality of micro-crystals 13a made from GaN are deposited on the side, opposite to the substrate 11, of the first conductive type cladding layer 12 by the sputtering process, MBE process, or laser deposition process, to form a light emitting layer 13. At this step, the grain size of each micro-crystal 13a, the covering ratio of the first conductive type cladding layer 12 with the micro-crystals 13a, and the stacked number of the micro-crystals 13a (that is, the thickness of the light emitting layer 13) are controlled by adjusting conditions such as the temperature of the substrate 11, atmospheric gas pressure, and deposition rate.

The formation of the light emitting layer 13 is followed by a heating treatment in a nitrogen containing atmosphere, for example, nitrogen plasma treatment, to interpolate nitrogen vacancies present in the micro-crystals 13a of the light emitting layer 13, thereby improving the crystallinity thereof. The heating treatment in the nitrogen containing atmosphere is followed by a heating treatment in an oxygen containing atmosphere, for example, oxygen plasma treatment, to oxidize the surface of a portion, being not in contact with the micro-crystals 13a, of the first conductive type cladding layer 12, thereby forming an insulating layer 15 made from a compound of boron and oxygen. During the heating treatment in the oxygen containing atmosphere, the surfaces of the micro-crystals 13 are slightly oxidized. From this viewpoint, it is essential that the heating treatment in the oxygen containing atmosphere is performed after the heating treatment in the nitrogen containing atmosphere because if the micro-crystals 13a have a number of defects, they are easy to be oxidized.

The heating treatment in the oxygen containing atmosphere is preferably followed by a heating treatment in a hydrogen containing atmosphere, for example, a hydrogen plasma treatment in order to remove the oxide film formed on the surfaces of the micro-crystals 13a and to further interpolate the nitrogen vacancies remaining in the micro-crystals 13a. After the heating treatment in the hydrogen containing atmosphere, a second conductive type cladding layer 14 formed of a non-single crystal body of p-type BN is formed on the side, opposite to the substrate 11, of the first conductive type cladding layer 12 via the light emitting layer 13 and the insulating layer 15 by the sputtering process or laser deposition process. Like the first embodiment, if the activation of the impurity doped in the second conductive type cladding layer 14 is insufficient, it is additionally performed by the laser annealing process.

After the formation of the second conductive type cladding layer 14, like the first embodiment, the second conductive type cladding layer 14, light emitting layer 13, and insulating layer 15 are selectively removed in sequence by lithography and etching, to expose part of the first conductive type cladding layer 12 corresponding to a position at which a first electrode 16 is to be formed. After exposure of part of the first conductive type cladding layer 12, like the first embodiment, each of a first electrode 16 and a second electrode 17 is selectively formed by sequentially vapor-depositing a nickel layer, a platinum layer, and a gold layer. The resultant structure is then subjected to a heating treatment, to alloy the metals forming each of the second electrode 17 and the first electrode 16. In this way, the light emitting diode 10 according to this embodiment is produced.

The light emitting diode 10 thus produced has the same function and effects as those of the light emitting diode according to the first embodiment, and can be used for the same applications as those described in the first embodiment. It should be noted that this embodiment can also be applied to the above-described second and third embodiments.

Fifth Embodiment of Light Emitting Device

Figure 8:
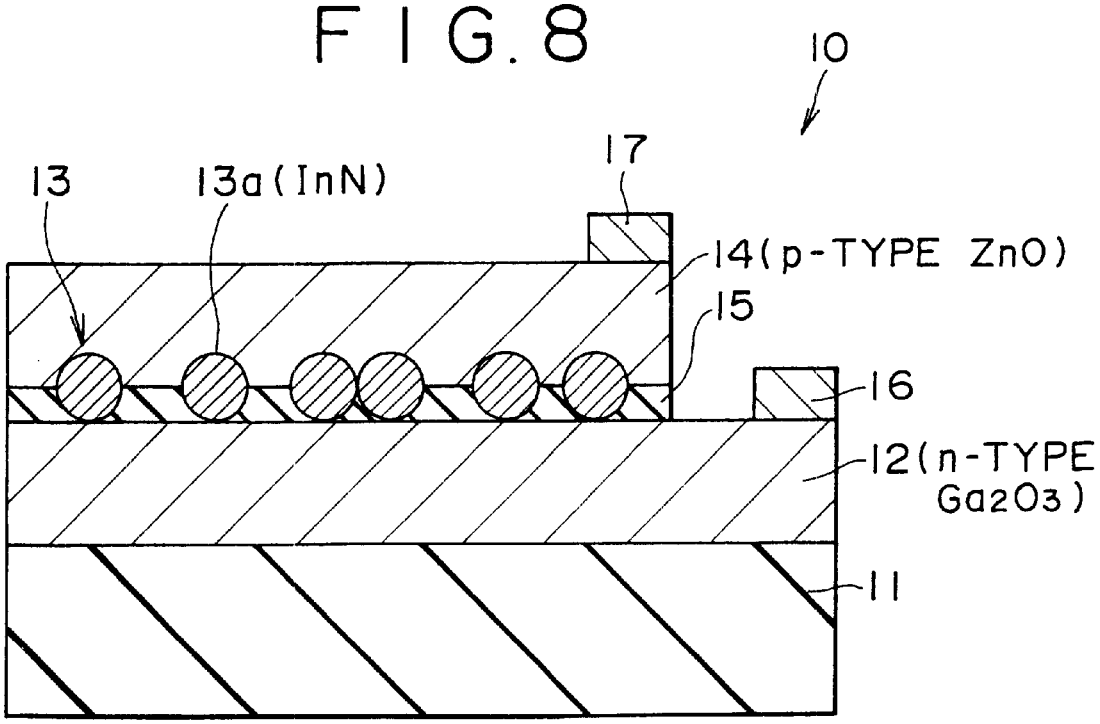
FIG. 8 is a sectional view showing a configuration of a light emitting diode according to a fifth embodiment of the light emitting device of the present invention.

FIG. 8 shows a sectional structure of a light emitting diode 10 according to a fifth embodiment of the light emitting device of the present invention. The light emitting diode 10 is another example different from that of the first embodiment in materials of a first conductive type cladding layer 12, a light emitting layer 13, a second conductive type cladding layer 14, an insulating layer 15, and a first electrode 16. In this embodiment, parts corresponding to those of the first embodiment are designated by the same reference numerals, and the detailed description thereof is omitted.

The first conductive type cladding layer 12 is formed of a non-single crystal body of $\beta$-$Ga_2O_3$ or n-type $Ga_2O_3$ doped with an n-type impurity such as Al. The light emitting layer 13 contains a plurality of micro-crystals 13a made from InN. The second conductive type cladding layer 14 is formed of a non-single crystal body of p-type ZnO doped with a p-type impurity such as nitrogen. The insulating layer 15 is made from a compound of gallium and nitrogen, or a compound of aluminum, gallium, and nitrogen. That is to say, according to this embodiment, each of the first conductive type cladding layer 12 and the second conductive type cladding layer 14 is made from the inorganic semiconductor containing oxygen, and the light emitting layer 13 is made from the inorganic semiconductor containing nitrogen.

Even in this embodiment in which the first conductive type cladding layer 12, light emitting layer 13, second conductive type cladding layer 14, and insulating layer 15 are made from the above-described materials, the band gap of the light emitting layer 13 is, like the first embodiment, smaller than that of each of the first conductive type cladding layer 12, second conductive type cladding layer 14, and insulating layer 15.

The first electrode 16 has a structure obtained by sequentially stacking a layer made from an Ni—Cr alloy, and a gold layer on the first conductive type cladding layer 12 and alloying them by heating.

The light emitting diode 10 configured as described above can be produced in accordance with the following procedure:

A substrate 11 is prepared, and a first conductive cladding layer 12 formed of a non-single crystal body of $\beta$-$Ga_2O_3$ or n-type Al-doped $Ga_2O_3$ is formed on one plane of the substrate 11 by the sputtering process, CVD process, MBE process, or laser deposition process. At this step, like the first embodiment, the temperature of the substrate 11 is set at 600° C. or less. Like the first embodiment, if the activation of the impurity doped in the first conductive type cladding layer 12 is insufficient, it is additionally performed by the laser annealing process.

A plurality of micro-crystals 13a made from InN are deposited on the side, opposite to the substrate 11, of the first conductive type cladding layer 12 by the sputtering process, MBE process, or laser deposition process, to form a light emitting layer 13. At this step, the grain size of each micro-crystal 13a, the covering ratio of the first conductive type cladding layer 12 with the micro-crystals 13a, and the stacked number of the micro-crystals 13a (that is, the thickness of the light emitting layer 13) are controlled by adjusting conditions such as the temperature of the substrate 11, atmospheric gas pressure, and deposition rate.

The formation of the light emitting layer 13 is followed by a heating treatment in a nitrogen containing atmosphere, for example, nitrogen plasma treatment, to interpolate nitrogen vacancies present in the micro-crystals 13a of the light emitting layer 13 thereby improving the crystallinity thereof, and to nitride the surface of a portion, being not in contact with the micro-crystals 13a, of the first conductive type cladding layer 12 thereby forming an insulating film 15 made from a compound of aluminum, gallium, and nitrogen. The heating treatment in the nitrogen containing atmosphere is followed by a heating treatment in a hydrogen containing atmosphere, for example, hydrogen plasma treatment, to interpolate the nitrogen vacancies remaining in the micro-crystals 13a, thereby further improving the crystallinity thereof.

After the heating treatments in the oxygen containing atmosphere and in the hydrogen containing atmosphere, a second conductive type cladding layer 14 formed of a non-single crystal body of p-type ZnO is formed on the side, opposite to the substrate 11, of the first conductive type cladding layer 12 via the light emitting layer 13 and the insulating layer 15 by the sputtering process, CVD process, MBE process, or the laser deposition process. Like the first embodiment, if the activation of the impurity doped in the second conductive type cladding layer 14 is insufficient, it is additionally performed by the laser annealing process.

After the formation of the second conductive type cladding layer 14, like the first embodiment, the second conductive type cladding layer 14, light emitting layer 13, and insulating layer 15 are selectively removed in sequence by lithography and etching, to expose part of the first conductive type cladding layer 12 corresponding to a position at which a first electrode 16 is to be formed. After exposure of part of the first conductive type cladding layer 12, like the first embodiment, a first electrode 16 is selectively formed by sequentially vapor-depositing a layer made from an Ni—Cr alloy and a gold layer, and a second electrode 17 is selectively formed by sequentially vapor-depositing a nickel layer, a platinum layer, and a gold layer. The resultant structure is then subjected to a heating treatment, to alloy the metals forming each of the second electrode 17 and the first electrode 16. In this way, the light emitting diode 10 according to this embodiment is produced.

The light emitting diode 10 thus produced has the same function and effects as those of the light emitting diode according to the first embodiment, and can be used for the same applications as those described in the first embodiment. It should be noted that this embodiment can also be applied to the above-described second and third embodiments.

Sixth Embodiment of Light Emitting Device

Figure 9:
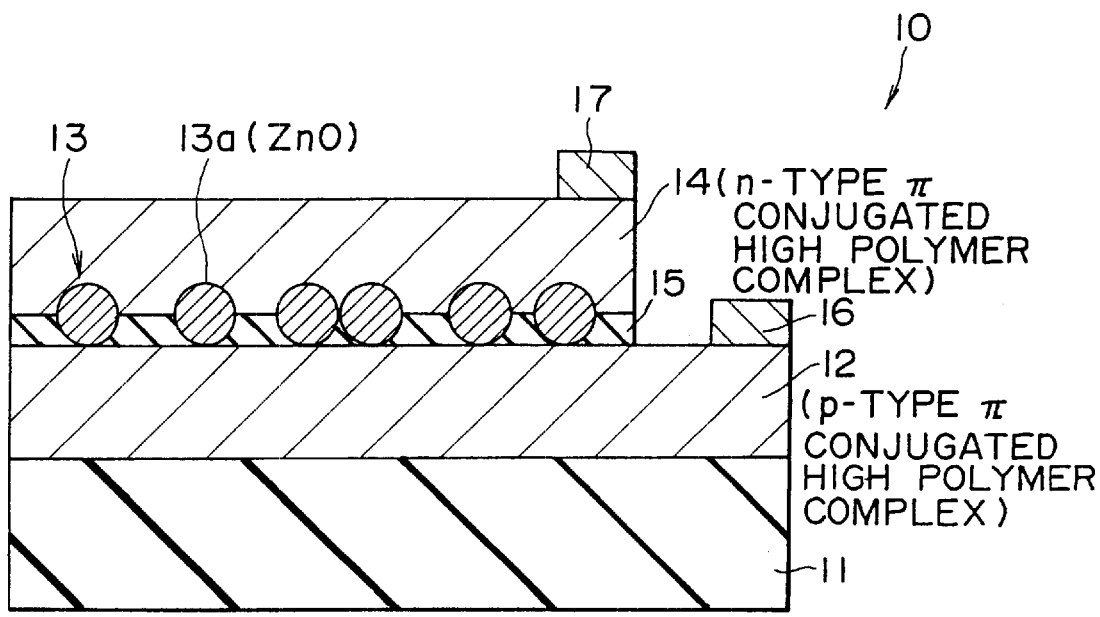
FIG. 9 is a sectional view showing a configuration of a light emitting diode according to a sixth embodiment of the light emitting device of the present invention.

FIG. 9 shows a sectional structure of a light emitting diode 10 according to a sixth embodiment of the light emitting device of the present invention. The light emitting diode 10 is a further example different from that of the first embodiment in materials of a substrate 11, a first conductive type cladding layer 12, a second conductive type cladding layer 14, an insulating layer 15, a first electrode 16, and a second electrode 17. In this embodiment, parts corresponding to those of the first embodiment are designated by the same reference numerals, and the detailed description thereof is omitted.

The substrate 11 may be made from glass, quartz or sapphire like the first embodiment; however, it may be made from a plastic material. This is because the first conductive type cladding layer 12 and the second conductive type cladding layer 14, each of which is made from an organic semiconductor as will be described later in this embodiment, can be produced at a lower temperature. The use of a plastic material as the material for forming the substrate 11 is advantageous in easily enlarging the area of the substrate 11 and reducing the material cost of the substrate 11.

The first conductive type cladding layer 12 is made from a p-type π conjugated high polymer complex obtained by adding a p-type additive to a complex of a π conjugated high polymer such as polypyrrole or poly (p-phenylene). Specific examples of the p-type additives may include a halogen such as iodine ($I_2$), bromine ($Br_2$), or iodine bromide (IBr), and a metal compound such as iron chloride ($FeCl_3$), aluminum chloride ($AlCl_3$), arsenic fluoride ($AsF_5$), or tin chloride ($SnCl_3$). The second conductive type cladding layer 14 is made from an n-type π conjugated high polymer complex obtained by adding an n-type additive to a complex of a π conjugated high polymer such as poly (p-phenylene), poly (2,5-pyridinediyl), or poly (quinoline). Specific examples of the n-type additives may include metals such as lithium (Li), potassium (K), and sodium (Na).

According to this embodiment, each of the first conductive type cladding layer 12 and the second conductive type cladding layer 14 is made from the organic semiconductor, and the first conductive type is a p-type and the second conductive type is an n-type.

The insulating layer 15 is made from an organic compound such as polyimide. Even in this embodiment in which the first conductive type cladding layer 12, second conductive type cladding layer 14, and insulating layer 15 are made from the above-described materials, the band gap of the light emitting layer 13 is, like the first embodiment, smaller than that of each of the first conductive type cladding layer 12, second conductive type cladding layer 14, and insulating layer 15.

The first electrode 16 is made from ITO (Indium Tin Oxide which is a compound of indium (In), tin (Sn) and oxygen) or tin oxide ($SnO_2$). The second electrode 17 is made from a metal such as indium, aluminum, magnesium, gold, or platinum, or an alloy such as MgIn (alloy of magnesium and indium), AlLi (alloy of aluminum and lithium), or MgAg (alloy of magnesium and silver). In addition, according to this embodiment, the first electrode 16 functions as a p-side electrode, and the second electrode 17 functions as an n-side electrode.

The light emitting diode 10 configured as described above can be produced in accordance with the following procedure:

A substrate 11 is prepared, and a first conductive type cladding layer 12 made from a p-type π conjugated high polymer complex is formed on one plane of the substrate 11 by a coating process, the vacuum vapor-deposition process, or the laser deposition process. Then, like the first embodiment, a plurality of micro-crystals 13a made from ZnO are deposited on the side, opposite to the substrate 11, of the first conductive type cladding layer 12, to form a light emitting layer 13. An insulating layer 15 made from polyimide is formed on the side, on which the light emitting layer 13 has been formed, of the first conductive type cladding layer 12 by the coating process, vacuum vapor-deposition process, or laser deposition process. After that, the insulating layer 15 is partially etched, to expose part of the light emitting layer 13 from the insulating layer 15.

After exposure of part of the light emitting layer 13, a second conductive type cladding layer 14 made from an n-type π conjugated high polymer complex is formed on the side, opposite to the substrate 11, of the first conductive type cladding layer 12 via the light emitting layer 13 and the insulating layer 15 by the coating process, vacuum vapor-deposition process, or laser deposition process. After the formation of the second conductive type cladding layer 14, like the first embodiment, the second conductive type cladding layer 14, light emitting layer 13, and insulating layer 15 are selectively removed in sequence by lithography and etching, to expose part of the first conductive type cladding layer 12 corresponding to a position at which a first electrode 16 is to be formed. Subsequently, a first electrode 16 and a second electrode 17 are selectively formed by vapor-deposition. In this way, the light emitting diode 10 according to this embodiment is produced.

The light emitting diode 10 thus produced has the same function and effects as those of the light emitting diode according to the first embodiment, and can be used for the same applications as those described in the first embodiment. Further, according to this embodiment, since each of the first conductive type cladding layer 12 and the second conductive type cladding layer 14 is made from the organic semiconductor, it can be formed at a lower temperature. As a result, the selection range of the material for forming the substrate 11 can be further extended. For example, the substrate 11 can be made from a plastic material. The use of a plastic material as the material for forming the substrate 11 allows the formation of a device array on the common substrate 11 having a large area at a low cost. It should be noted that this embodiment can also be applied to the above-described second and third embodiments.

Seventh Embodiment of Light Emitting Device

Figure 10:
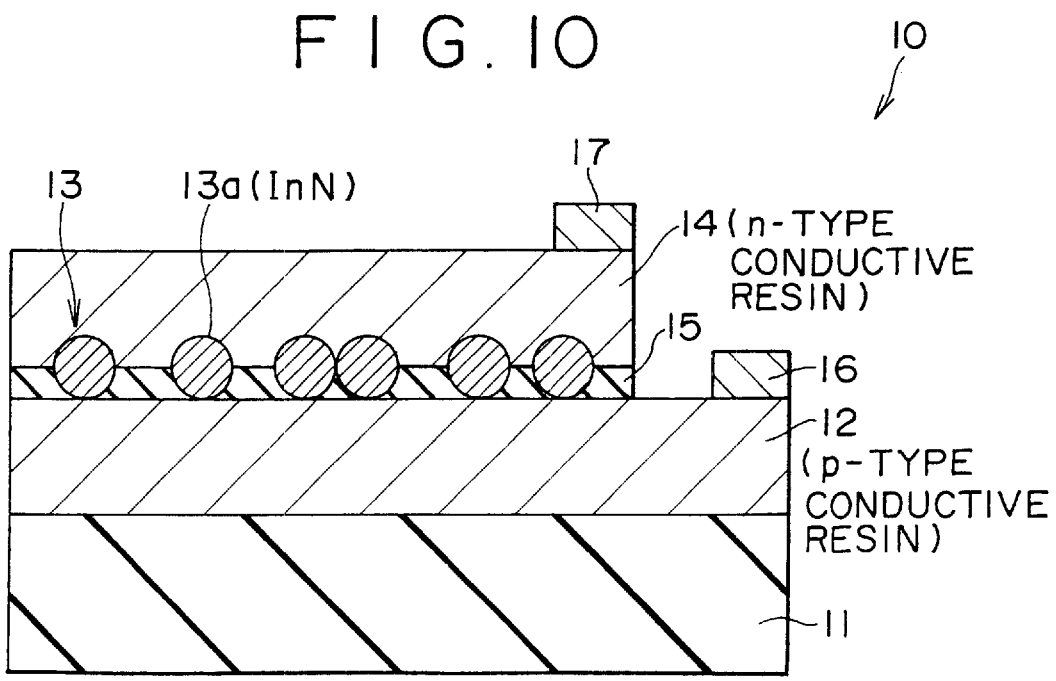
FIG. 10 is a sectional view showing a configuration of a light emitting diode according to a seventh embodiment of the light emitting device of the present invention.

FIG. 10 shows a sectional structure of a light emitting diode 10 according to a seventh embodiment of the light emitting device of the present invention. The light emitting diode 10 is a further example different from that of the first embodiment in materials of a substrate 11, a first conductive type cladding layer 12, a light emitting layer 13, a second conductive type cladding layer 14, an insulating layer 15, a first electrode 16, and a second electrode 17. In this embodiment, parts corresponding to those of the first embodiment are designated by the same reference numerals, and the detailed description thereof is omitted.

The substrate 11 is, like the sixth embodiment, made from glass, quartz, sapphire, or a plastics material. The first conductive type cladding layer 12 is made from a p-type conductive resin obtained by mixing a high polymer compound such as polyvinyl alcohol with a conductor, typically, ultrafine particles of a metal sulfide such as copper sulfide (CuS). The light emitting layer 13 contains a plurality of micro-crystals 13a made from InN. The second conductive type cladding layer 14 is made from an n-type conductive resin obtained by mixing a high polymer compound such as polyvinyl alcohol with a conductor, typically, ultrafine particles of metal sulfide such as mercury sulfide (HgS). That is to say, according to the light emitting diode 10, each of the first conductive type cladding layer 12 and the second conductive type cladding layer 14 is made from the conductive resin, and the first conductive type cladding layer 12 is configured as the p-type cladding layer and the second conductive type cladding layer 14 is configured as the n-type cladding layer.

The insulating layer 15 is, like the sixth embodiment, made from an organic compound such as polyimide. Even in this embodiment in which the first conductive type cladding layer 12, light emitting layer 13, second conductive type cladding layer 14, and insulating layer 15 are made from the above-described materials, the band gap of the light emitting layer 13 is, like the first embodiment, smaller than that of each of the first conductive type cladding layer 12, second conductive type cladding layer 14, and insulating layer 15.

The first electrode 16 and the second electrode 17 are made from the same materials as those for forming the first electrode 16 and the second electrode 17 in the sixth embodiment. Like the sixth embodiment, the first electrode 16 functions as a p-side electrode, and the second electrode 17 functions as an n-side electrode.

The light emitting diode 10 configured as described above can be produced in accordance with the following procedure:

One plane of a substrate 11 is coated with an organo-sol containing ultrafine particles of a metal sulfide, followed by drying of the organo-sol, to form a first conductive type cladding layer 12 made from a p-type conductive resin. A plurality of micro-crystals 13a made from InN are deposited on the first conductive type cladding layer 12, to form a light emitting layer 13, and subsequently, an insulating layer 15 made from polyimide is formed. The insulating layer 15 is partially etched, to expose part of the light emitting layer 13 from the insulating layer 15. The insulating layer 15 and the exposed portion of the light emitting layer 13 are coated with an organo-sol containing ultrafine particles of a metal sulfide, followed by drying of the organo-sol, to form a second conductive type cladding layer 14 made from an n-type conductive resin. After that, part of the first conductive type cladding layer 12 is exposed by lithography and etching, and a first electrode 16 and a second electrode 17 are selectively formed. In this way, the light emitting diode 10 according to this embodiment is produced.

The light emitting diode 10 thus produced has the same function and effects as those of the light emitting diode according to the first embodiment, and can be used for the same applications as those described in the first embodiment. Further, according to this embodiment, since each of the first conductive type cladding layer 12 and the second conductive type cladding layer 14 is made from the conductive resin, it can be formed at a lower temperature. It should be noted that this embodiment can also be applied to the above-described second and third embodiments.

Eighth Embodiment of Light Emitting Device

Figure 11:
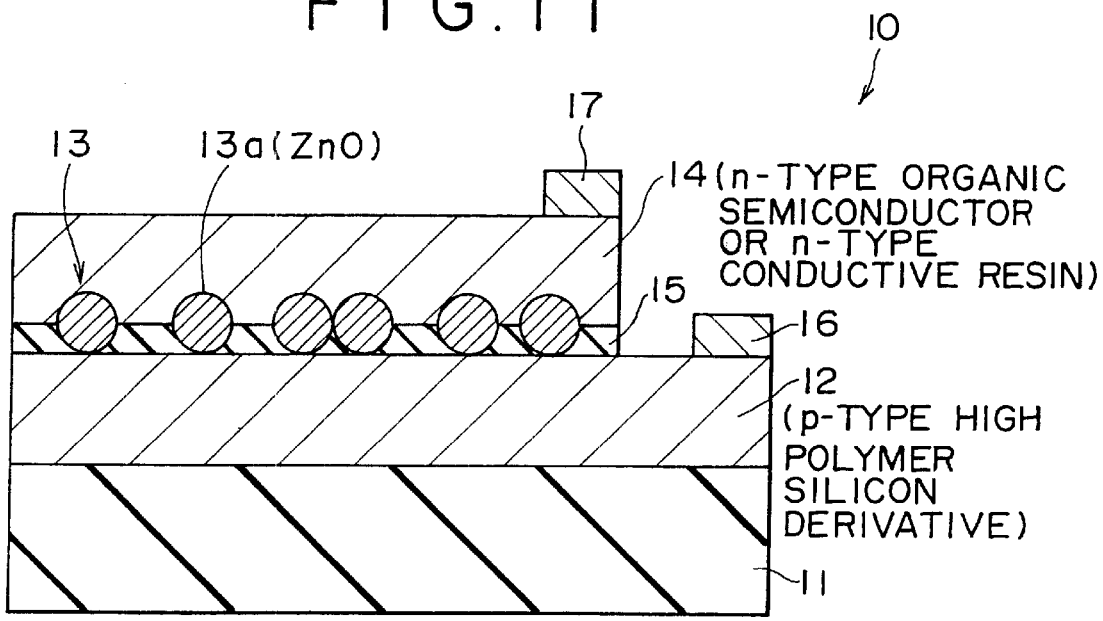
FIG. 11 is a sectional view showing a configuration of a light emitting diode according to an eighth embodiment of the light emitting device of the present invention.

FIG. 11 shows a sectional structure of a light emitting diode 10 according to an eighth embodiment of the light emitting device of the present invention. The light emitting diode 10 is a further example different from that of the first embodiment in materials of a substrate 11, a first conductive type cladding layer 12, a second conductive type cladding layer 14, an insulating layer 15, a first electrode 16, and a second electrode 17. In this embodiment, parts corresponding to those of the first embodiment are designated by the same reference numerals, and the detailed description thereof is omitted.

The substrate 11 is, like the sixth embodiment, made from glass, quartz, sapphire, or a plastic material. The first conductive type cladding layer 12 is made from a p-type high polymer silicon derivative obtained by adding a p-type additive to a high polymer silicon derivative such as organo-polysilane or silanylene based polymer. Specific examples of the p-type additives may include a halogen such as iodine, and a metal compound such as iron chloride, aluminum chloride, arsenic fluoride, or tin chloride. The second conductive type cladding layer 14 is made from an n-type π conjugated high polymer complex or n-type high polymer metal complex to which an n-type impurity is added, or an n-type conductive resin obtained by adding a conductor to a high polymer compound. That is to say, according to this light emitting diode 10, the first conductive type cladding layer 12 is configured as the p-type cladding layer made from the organic semiconductor, and the second conductive type cladding layer 14 is configured as the n-type cladding layer made from the organic semiconductor or conductive resin.

The insulating layer 15 is, like the sixth embodiment, made from an organic compound such as polyimide. Even in this embodiment in which the first conductive type cladding layer 12, second conductive type cladding layer 14, and insulating layer 15 are made from the above-described materials, the band gap of the light emitting layer 13 is, like the first embodiment, smaller than that of each of the first conductive type cladding layer 12, second conductive type cladding layer 14, and insulating layer 15.

The first electrode 16 and the second electrode 17 are made from the same materials as those for forming the first electrode 16 and second electrode 17 in the sixth embodiment. In addition, like the sixth embodiment, the first electrode 16 functions as a p-side electrode, and the second electrode 17 functions as an n-side electrode.

The light emitting diode 10 configured as described above can be produced in accordance with the same procedure as that described in the sixth embodiment. The light emitting diode 10 thus produced has the same function and effects as those of the light emitting diode according to the first embodiment, and can be used for the same applications as those described in the first embodiment. Further, according to this embodiment, since the first conductive type cladding layer 12 is made from the organic semiconductor and the second conductive type cladding layer 14 is made from the organic semiconductor or conductive resin, they can be formed at a lower temperature. It should be noted that this embodiment can also be applied to the above-described second and third embodiments.

Ninth Embodiment of Light Emitting Device

Figure 12:
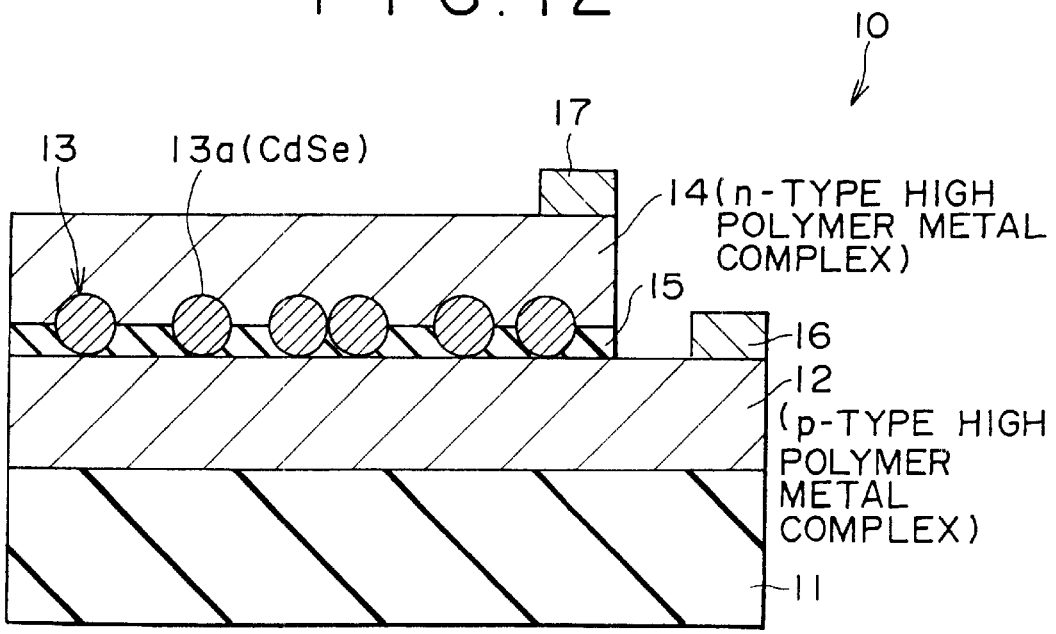
FIG. 12 is a sectional view showing a configuration of a light emitting diode according to a ninth embodiment of the light emitting device of the present invention.

FIG. 12 shows a sectional structure of a light emitting diode 10 according to a ninth embodiment of the light emitting device of the present invention. The light emitting diode 10 is a further example different from that of the first embodiment in materials of a substrate 11, a first conductive type cladding layer 12, a light emitting layer 13, a second conductive type cladding layer 14, an insulating layer 15, a first electrode 16, and a second electrode 17. In this embodiment, parts corresponding to those of the first embodiment are designated by the same reference numerals, and the detailed description thereof is omitted.

The substrate 11 is, like the sixth embodiment, made from glass, quartz, sapphire, or a plastic material. The first conductive type cladding layer 12 is made from a p-type high polymer metal complex by adding a p-type additive to a high polymer metal complex. Specific examples of the high polymer complexes may include a metal phthalocyanine containing a metal such as iron, nickel, copper (Cu), zinc (Zn), platinum, lead (Pb), chromium (Cr), ruthenium (Ru), rhodium (Rh), silicon, germanium (Ge), or tin (Sn); or a derivative thereof. Specific examples of the p-type additives may include a halogen such as iodine, bromine, or iodine bromide, and a metal compound such as iron chloride, aluminum chloride, arsenic fluoride, or tin chloride.

The light emitting layer 13 contains a plurality of microcrystals 13a made from CdSe. The second conductive type cladding layer 14 is made from an n-type high polymer metal complex obtained by adding an n-type impurity to a high polymer metal complex. Specific examples of the high polymer metal complexes may include a metal phthalocyanine, perylene pigment, and porphyrin metal complex containing a metal such as cobalt (Co). As the n-type additive, there is used a halogen such as iodine. That is to say, according to this light emitting diode 10, like the sixth embodiment, each of the first conductive type cladding layer 12 and the second conductive type cladding layer 14 is made from the organic semiconductor, and the first conductive type cladding layer 12 is configured as the p-type cladding layer and the second conductive type cladding layer 14 is configured as the n-type cladding layer.

The insulating layer 15 is, like the sixth embodiment, made from an organic compound such as polyimide. Even in this embodiment in which the first conductive type cladding layer 12, light emitting layer 13, second conductive type cladding layer 14, and insulating layer 15 are made from the above-described materials, the band gap of the light emitting layer 13 is, like the first embodiment, smaller than that of each of the first conductive type cladding layer 12, second conductive type cladding layer 14, and insulating layer 15.

The first electrode 16 and the second electrode 17 are made from the same materials as those for forming the first electrode 16 and the second electrode 17 in the sixth embodiment. In addition, like the sixth embodiment, the first electrode 16 functions as a p-side electrode, and the second electrode 17 functions as an n-side electrode.

The light emitting diode 10 configured as described above can be produced in accordance with the same procedure as that described in the sixth embodiment. The light emitting diode 10 thus produced has the same function and effects as those of the light emitting diode according to the first embodiment, and can be used for the same applications as those described in the first embodiment. Further, according to this embodiment, since each of the first conductive type cladding layer 12 and the second conductive type cladding layer 14 is made from the organic semiconductor, it can be formed at a lower temperature. It should be noted that this embodiment can also be applied to the above-described second and third embodiments.

Tenth Embodiment of Light Emitting Device

FIG. 13 shows a sectional structure of a light emitting diode 10 according to a tenth embodiment of the light emitting device of the present invention. The light emitting diode 10 is a further example different from that of the first embodiment in materials of a substrate 11, a first conductive type cladding layer 12, a light emitting layer 13, a second conductive type cladding layer 14, an insulating layer 15, a first electrode 16, and a second electrode 17. In this embodiment, parts corresponding to those of the first embodiment are designated by the same reference numerals, and the detailed description thereof is omitted.

The substrate 11 is, like the sixth embodiment, made from glass, quartz, sapphire, or a plastic material. The first conductive type cladding layer 12 is, like the sixth embodiment, made from a p-type π conjugated high polymer complex. The light emitting layer 13 contains a plurality of microcrystals 13a made from InN. The second conductive type cladding layer 14 is, like the sixth embodiment, made from an n-type π conjugated high polymer complex. The insulating layer 15 is, like the sixth embodiment, made from an organic compound such as polyimide. The first electrode 16 and the second electrode 17 are made from the same materials as those for forming the first electrode 16 and the second electrode 17 in the sixth embodiment. That is to say, this embodiment has the same structure as that of the sixth embodiment except for the material for forming the light emitting layer 13.

The light emitting diode 10 configured as described above can be produced in accordance with the same procedure as that described in the sixth embodiment. The light emitting diode 10 thus produced has the same function and effects as those of the light emitting diode according to the first embodiment, and can be used for the same applications as those described in the first embodiment. Further, according to this embodiment, the first conductive type cladding layer 12 and the second conductive type cladding layer 14 can be formed at a lower temperature. It should be noted that this embodiment can also be applied to the above-described second and third embodiments.

Eleventh Embodiment of Light Emitting Device

FIG. 14 shows a sectional structure of a light emitting diode 10 according to an eleventh embodiment of the light emitting device of the present invention. The light emitting diode 10 has the same structure as that of the light emitting diode of the first embodiment in configurations of a first conductive type cladding layer 12 and a second conductive type cladding layer 14 and in material for forming a first electrode 16. The light emitting diode 10 can be produced in accordance with the same procedure as that described in the first embodiment, and can be used for the same applications as those described in the first embodiment. In this embodiment, parts corresponding to those of the first embodiment are designated by the same reference numerals, and the detailed description thereof is omitted.

The first conductive type cladding layer 12 has a multi-layer structure composed of a first layer 12a and a second layer 12b sequentially stacked on a substrate 11. The first layer 12a has a thickness of 0.4 μm and is formed of a non-single crystal body of n-type BN doped with an n-type impurity such as carbon. The second layer 12b has a thickness of 0.1 μm and is formed of a non-single crystal body of n-type AlGaN doped with an n-type impurity such as silicon.

The second conductive type cladding layer 14 has a multi-layer structure composed of a first layer 14a and a second layer 14b sequentially stacked on the light emitting layer 13. The first layer 14a has a thickness of 0.1 μm, and is formed of a non-single crystal body of p-type AlGaN doped with a p-type impurity such as magnesium. The second layer 14b has a thickness of 0.4 μm, and is formed of a non-single crystal body of p-type BN doped with a p-type impurity such as magnesium.

The first electrode 16 functions as an n-side electrode, and has a structure obtained by sequentially stacking a titanium layer, a nickel layer, a platinum layer, and a gold layer on the first conductive type cladding layer 12 and alloying them by heating.

Figure 15:
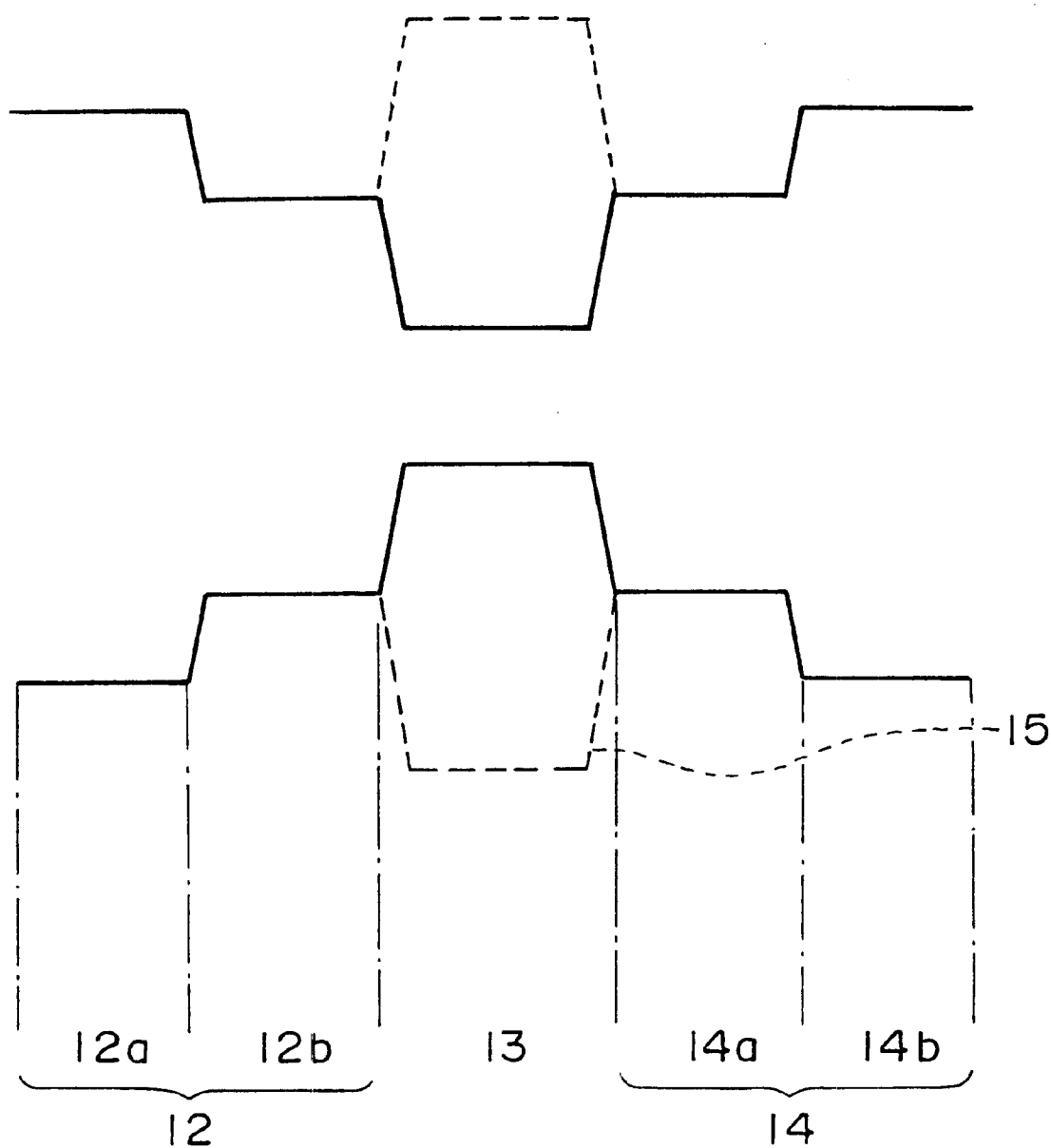
FIG. 15 is a diagram showing a band gap structure of the light emitting diode shown in FIG. 14.

FIG. 15 shows a band gap structure of the light emitting diode 10. In FIG. 15, a solid line designates the band gaps of the first conductive type cladding layer 12, light emitting layer 13, and second conductive type cladding layer 14, and a broken line designates the band gap of the insulating layer 15. With respect to the band gap of the first conductive type cladding layer 12, the band gap of the first layer 12a is about 6.2 eV and the band gap of the second layer 12b is in a range of about 3.4 to 4.8 eV. That is to say, the band gap of the second layer 12b on the light emitting layer 13 side is smaller than the band gap of the first layer 12a on the opposite side. With respect to the second conductive type cladding layer 14, the band gap of the first layer 14a is in a range of about 3.4 to 4.8 eV and the band gap of the second layer 14b is about 6.2 eV. That is to say, the band gap of the first layer 14a on the light emitting layer 13 side is smaller than the band gap of the second layer 14b on the opposite side. The reason why the band gap of each of the layers 12b and 14a on the light emitting layer 13 side is smaller than the band gap of each of the layers 12a and 14b on the opposite side is to enhance the injection efficiency of electric charges, thereby improving the emission efficiency. The band gap of the light emitting layer 13 is about 3.3 eV, which is smaller than the band gap of each of the first conductive type cladding layer 12, second conductive type cladding layer 14, and insulating layer 15, like the first embodiment.

In this light emitting diode 10, when a specific voltage is applied between the first electrode 16 and the second electrode 17, a current is injected in the micro-crystals 13a of the light emitting layer 13, to generate light emission at the micro-crystals 13a. According to this embodiment, since each of the first conductive type cladding layer 12 and the second conductive type cladding layer 14 has the multi-layer structure and has the band gap which becomes stepwise smaller toward the light emitting layer 13 side, the injection efficiency of electric charges can be enhanced, to thereby improve the emission efficiency.

In this way, according to this embodiment, in addition to the same effects as those obtained by the first embodiment, since each of the first conductive type cladding layer 12 and the second conductive type cladding layer 14 has the multi-layer structure and has the band gap which becomes stepwise smaller toward the light emitting layer 13 side, it is possible to obtain the effect of improving the emission efficiency. It should be noted that this embodiment can be applied to the above-described second to fifth embodiments.

Twelfth Embodiment of Light Emitting Device

Figure 16:
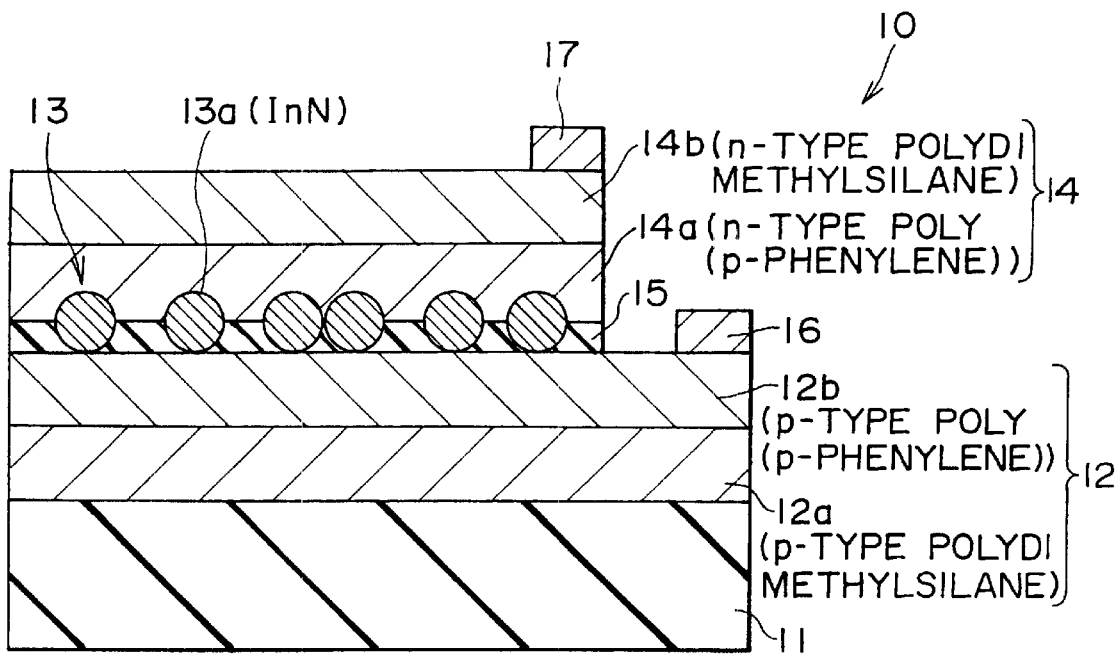
FIG. 16 is a sectional view showing a configuration of a light emitting diode according to a twelfth embodiment of the light emitting device of the present invention.

FIG. 16 shows a sectional structure of a light emitting diode 10 according to a twelfth embodiment of the light emitting device of the present invention. The light emitting diode 10 has the same structure as that of the light emitting diode of the first embodiment except for configurations of a first conductive type cladding layer 12 and a second conductive type cladding layer 14 and for materials for forming a substrate 11, a light emitting layer 13, an insulating layer 15, a first electrode 16, and a second electrode 17. In this embodiment, parts corresponding to those of the first embodiment are designated by the same reference numerals, and the detailed description thereof is omitted.

The first conductive type cladding layer 12 has a multi-layer structure composed of a first layer 12a and a second layer 12b sequentially stacked on a substrate 11. The first layer 12a has a thickness of 0.4 μm and is made from p-type polydimethylsilane to which a p-type additive is added. The second layer 12b has a thickness of 0.1 μm and is made from p-type (p-phenylene) to which a p-type additive is added. The band gap of the first layer 12a is about 3.5 eV and the band gap of the second layer 12b is about 3.2 eV.

The second conductive type cladding layer 14 has a multi-layer structure composed of a first layer 14a and a second layer 14b sequentially stacked on the light emitting layer 13. The first layer 14a has a thickness of 0.4 μm, and is made from n-type poly (p-phenylene) to which an n-type additive is added. The second layer 14b has a thickness of 0.1 μm, and is made from n-type polydimethylsilane to which an n-type additive is added. The band gap of the first layer 14a is about 3.2 eV and the band gap of the second layer 14b is about 3.5 eV. That is to say, according to this embodiment, each of the first conductive type cladding layer 12 and the second conductive type cladding layer 14 has the multi-layer structure made from the organic semiconductor, and has the band gap which becomes smaller toward the light emitting layer 13 side.

Like the sixth embodiment in which each of the first conductive type cladding layer 12 and the second conductive type cladding layer 14 is made from the organic semiconductor, the substrate 11 is made from glass, quartz, sapphire, or a plastic material. The light emitting layer 13 contains a plurality of micro-crystals 13a made from InN. The insulating layer 15 is, like the sixth embodiment, made from an organic compound such as polyimide. The band gap of the light emitting layer 13 is about 1.9 eV, which is smaller than the band gap of each of the first conductive type cladding layer 12, second conductive type cladding layer 14, and insulating layer 15, like the first embodiment.

The first electrode 16 and the second electrode 17 are made from the same materials as those for forming the first electrode 16 and the second electrode 17 in the sixth embodiment. Like the sixth embodiment, the first electrode 16 functions as a p-side electrode, and the second electrode 17 functions as an n-side electrode.

The light emitting diode 10 configured as described above can be produced in accordance with the same procedure as that described in the sixth embodiment. The light emitting diode 10 thus produced has the same function as that of the light emitting diode of the first embodiment, and can be used for the same applications as those described in the first embodiment. Further, according to this embodiment, since each of the first conductive type cladding layer 12 and the second conductive type cladding layer 14 has the multi-layer structure and has the band gap which becomes stepwise smaller toward the light emitting layer 13 side, it is possible to enhance the injection efficiency of electric charges and hence to improve the emission efficiency.

In this way, according to this embodiment, in addition to the same effects as those obtained by the first embodiment, since each of the first conductive type cladding layer 12 and the second conductive type cladding layer 14 is made from the organic semiconductor, it can be formed at a lower temperature, and since each of the first conductive type cladding layer 12 and the second conductive type cladding layer 14 has the multi-layer structure and has the band gap which becomes stepwise smaller toward the light emitting layer 13 side, the emission efficiency can be further improved. It should be noted that this embodiment can be applied to the above-described second, third, and sixth to tenth embodiments.

Thirteenth Embodiment of Light Emitting Device

Figure 17:
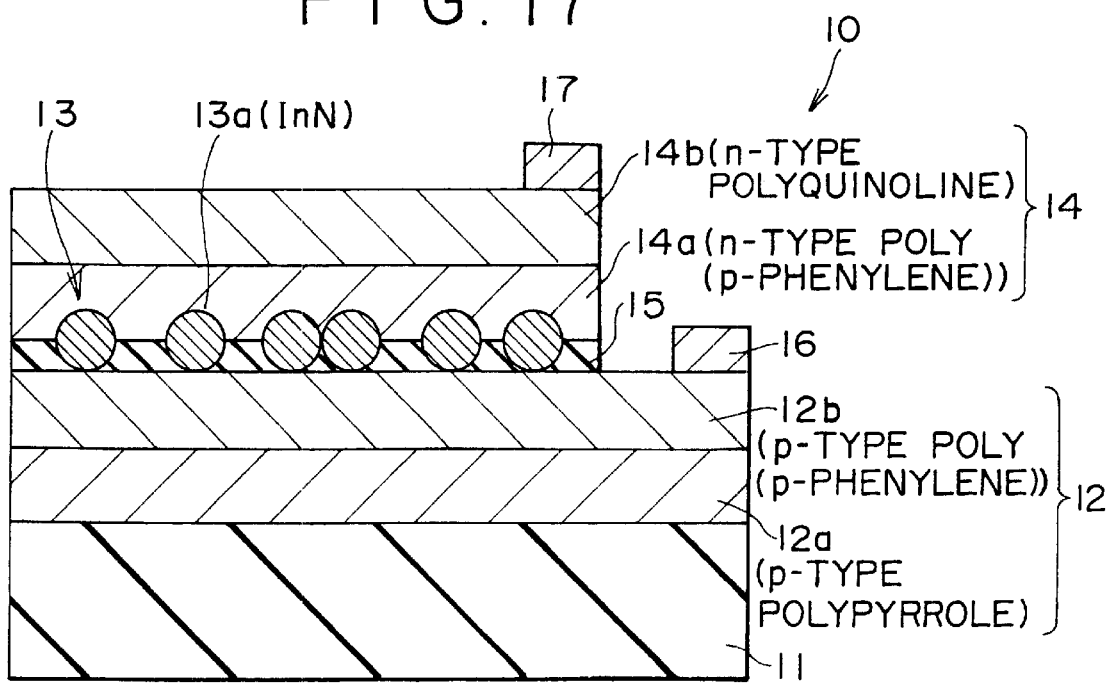
FIG. 17 is a sectional view showing a configuration of a light emitting diode according to a thirteenth embodiment of the light emitting device of the present invention.

FIG. 17 shows a sectional structure of a light emitting diode 10 according to a thirteenth embodiment of the light emitting device of the present invention. The light emitting diode 10 has the same structure as that of the light emitting diode of the first embodiment except for configurations of a first conductive type cladding layer 12 and a second conductive type cladding layer 14 and for materials for forming a substrate 11, a light emitting layer 13, an insulating layer 15, a first electrode 16, and a second electrode 17. In this embodiment, parts corresponding to those of the first embodiment are designated by the same reference numerals, and the detailed description thereof is omitted.

The first conductive type cladding layer 12 has a multi-layer structure composed of a first layer 12a and a second layer 12b sequentially stacked on a substrate 11. The first layer 12a has a thickness of 0.4 μm and is made from p-type polypyrrole to which a p-type additive is added. The second layer 12b has a thickness of 0.1 μm and is made from p-type (p-phenylene) to which a p-type additive is added. The band gap of the first layer 12a is about 3.6 eV and the band gap of the second layer 12b is about 3.2 eV.

The second conductive type cladding layer 14 has a multi-layer structure composed of a first layer 14a and a second layer 14b sequentially stacked on the light emitting layer 13. The first layer 14a has a thickness of 0.1 μm, and is made from n-type poly (p-phenylene) to which an n-type additive is added. The second layer 14b has a thickness of 0.4 μm, and is made from n-type polyquinoline to which an n-type additive is added. The second layer 14b is highly adhesive to the second electrode 17, and therefore, it has a function as an adhesive layer for enhancing the adhesiveness to the second electrode 17. The band gap of each of the first layer 14a and the second layer 14b is about 3.2 eV. That is to say, according to this embodiment, each of the first conductive type cladding layer 12 and the second conductive type cladding layer 14 has the multi-layer structure made from the organic semiconductor, and the first conductive type cladding layer 12 has the band gap which becomes smaller toward the light emitting layer 13 side and the second conductive type cladding layer 14 has the adhesive layer on the second electrode 17 side.

Like the sixth embodiment in which each of the first conductive type cladding layer 12 and the second conductive type cladding layer 14 is made from the organic semiconductor, the substrate 11 is made from glass, quartz, sapphire, or a plastic material. The light emitting layer 13 contains a plurality of micro-crystals 13a made from InN. The insulating layer 15 is, like the sixth embodiment, made from an organic compound such as polyimide. The band gap of the light emitting layer 13 is about 1.9 eV, which is smaller than the band gap of each of the first conductive type cladding layer 12, second conductive type cladding layer 14, and insulating layer 15, like the first embodiment. The first electrode 16 and the second electrode 17 are made from the same materials as those for forming the first electrode 16 and the second electrode 17 in the sixth embodiment. Like the sixth embodiment, the first electrode 16 functions as a p-side electrode, and the second electrode 17 functions as an n-side electrode.

The light emitting diode 10 configured as described above can be produced in accordance with the same procedure as that described in the sixth embodiment. The light emitting diode 10 thus produced has the same function as that of the light emitting diode of the first embodiment, and can be used for the same applications as those described in the first embodiment. Further, according to this embodiment, since the first conductive type cladding layer 12 has the multi-layer structure and has the band gap which becomes stepwise smaller toward the light emitting layer 13 side, it is possible to enhance the injection efficiency of electric charges and hence to improve the emission efficiency.

In this way, according to this embodiment, in addition to the same effects as those obtained by the first embodiment, since each of the first conductive type cladding layer 12 and the second conductive type cladding layer 14 is made from the organic semiconductor, it can be formed at a lower temperature, and since the first conductive type cladding layer 12 has the multi-layer structure and has the band gap which becomes stepwise smaller toward the light emitting layer 13 side, the emission efficiency can be further improved. Further, since the second conductive type cladding layer 14 has the multi-layer structure and has the adhesive layer on the second electrode 17 side, it is possible to improve the adhesiveness of the second electrode 17. It should be noted that this embodiment can be applied to the above-described second to twelfth embodiments.

Fourteenth Embodiment of Light Emitting Device

FIG. 18 shows a sectional structure of a light emitting diode 10 according to a fourteenth embodiment of the light emitting device of the present invention. The light emitting diode 10 has the same structure as that of the light emitting diode of the first embodiment except for the configuration of a second conductive type cladding layer 14 (which has a multi-layer structure), omission of the second electrode, and materials for forming a substrate 11, a first conductive type cladding layer 12, a light emitting layer 13, a second conductive type cladding layer 14, an insulating layer 15, and a first electrode 16. In this embodiment, parts corresponding to those of the first embodiment are designated by the same reference numerals, and the detailed description thereof is omitted.

Like the sixth embodiment in which each of the first conductive type cladding layer 12 and the second conductive type cladding layer 14 is made from the organic material, the substrate 11 is made from glass, quartz, sapphire, or a plastics material. The first conductive type cladding layer 12 is made from a p-type organic semiconductor such as p-type poly (p-phenylene) to which a p-type additive is added. The band gap of the first conductive type cladding layer 12 is about 3.2 eV. The light emitting layer 13 contains a plurality of micro-crystals 13a made from InN.

The second conductive type cladding layer 14 has a multi-layer structure composed of a first layer 14a and a second layer 14b sequentially stacked on the light emitting layer 13. The first layer 14a has a thickness of 0.1 $\mu$m, and is made from n-type polyquinoline to which an n-type additive is added. The second layer 14b has a thickness of 0.4 $\mu$m, and is made from n-type poly (p-phenylene) to which an n-type additive is added. The second layer 14b has a high conductivity, and is taken as an electrode layer functioning as a second electrode (an n-side electrode). The band gap of each of the first layer 14a and the second layer 14b is about 3.2 eV.

The insulating layer 15 is, like the sixth embodiment, made from an organic compound such as polyimide. Even in this embodiment in which the first conductive type cladding layer 12, light emitting layer 13, second conductive type cladding layer 14, and insulating layer 15 are made from the above-described materials, the band gap of the light emitting layer 13 is, like the first embodiment, smaller than that of each of the first conductive type cladding layer 12, second conductive type cladding layer 14, and insulating layer 15.

The first electrode 16 is, like the sixth embodiment, made from ITO or tin oxide ($SnO_2$). The first electrode 16 functions as a p-side electrode.

The light emitting diode 10 configured as described above can be produced in accordance with the same procedure as that described in the sixth embodiment. The light emitting diode 10 thus produced has the same function and effects as those of the light emitting diode of the first embodiment, and can be used for the same applications as those described in the first embodiment. Further, according to this embodiment, since each of the first conductive type cladding layer 12 and the second conductive type cladding layer 14 is made from the organic semiconductor, it can be formed at a lower temperature, and since the second conductive type cladding layer 14 has the multi-layer structure including the electrode layer, it is possible to eliminate the need of newly forming a second electrode made from a metal or a metal alloy, and hence to simplify the device structure and the production steps. It should be noted that this embodiment can be applied to the above-described second to thirteenth embodiments.

Fifteenth Embodiment of Light Emitting Device

Figure 19:
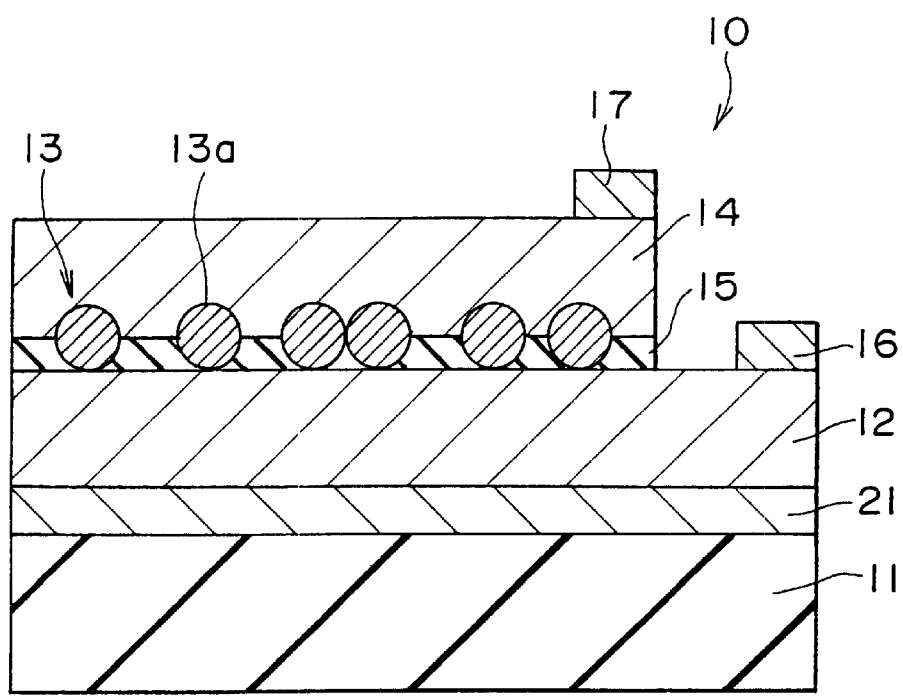
FIG. 19 is a sectional view showing a configuration of a light emitting diode according to a fifteenth embodiment of the light emitting device of the present invention.

FIG. 19 shows a sectional structure of a light emitting diode 10 according to a fifteenth embodiment of the light emitting device of the present invention. The light emitting diode 10 has the same structure as that of the light emitting diode of the first embodiment except that a diffusion preventive layer 21 is provided between a substrate 11 and a first conductive type cladding layer 12, and can be used for the same applications as those described in the first embodiment. In this embodiment, parts corresponding to those of the first embodiment are designated by the same reference numerals, and the detailed description thereof is omitted.

The diffusion preventive layer 21 is provided for preventing the diffusion of components between the substrate 11 and the first conductive type cladding layer 12 and for enhancing the adhesiveness between the substrate 11 and the first conductive type cladding layer 12. The diffusion preventive layer 21 has a thickness of several nm, and is made from titanium nitride ($Ti_3N_4$) or silicon nitride ($Si_3N_4$).

The light emitting diode 10 can be produced in accordance with the same procedure as that described in the first embodiment. In addition, the diffusion preventive layer 21 is formed by the sputtering process, CVD process, or laser deposition process.

According to the light emitting diode 10, when a specific voltage is applied to the first electrode 16 and the second electrode 17, a current is injected in the micro-crystals 13a of the light emitting layer 13, to generate light emission in the micro-crystals 13a. In this embodiment, since the diffusion preventive layer 21 is provided, it is possible to prevent the diffusion of components between the substrate 11 and the first conductive type cladding layer 12 and ensure the adhesiveness between the substrate 11 and the first conductive type cladding layer 12, and hence to ensure the quality of the light emitting diode 10.

In this way, according to this embodiment, in addition to the effects obtained by the first embodiment, since the diffusion preventive layer 21 is provided, it is possible to prevent the diffusion of components between the substrate 11 and the first conductive type cladding layer 12 and ensure the adhesiveness between the substrate 11 and the first conductive type cladding layer 12, and hence to ensure the quality of the light emitting diode 10. It should be noted that this embodiment can be applied to the above-described second to fourteenth embodiments.

Sixteenth Embodiment of Light Emitting Device

Figure 20:
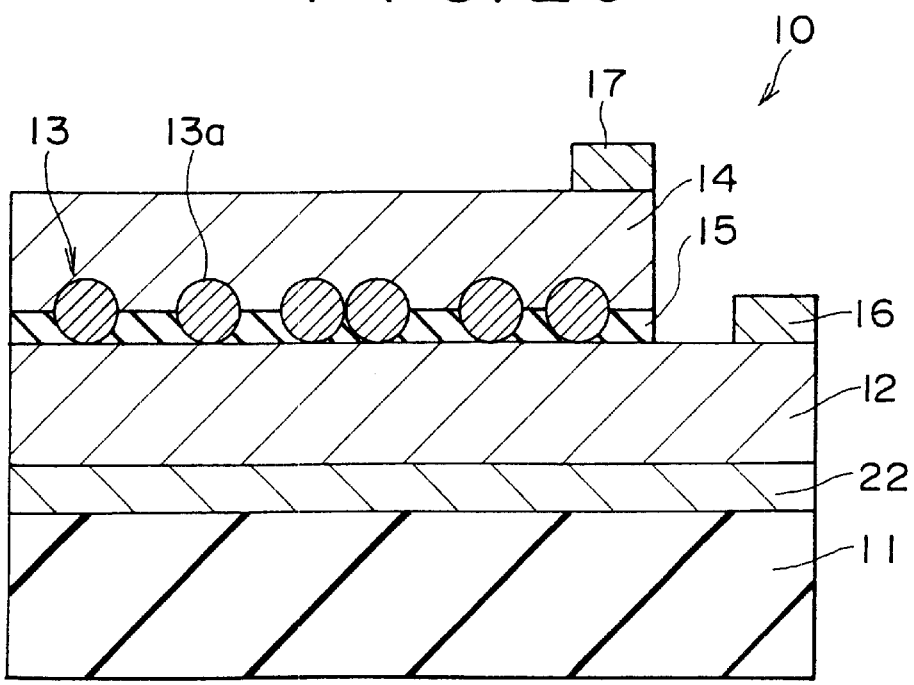
FIG. 20 is a sectional view showing a configuration of a light emitting diode according to a sixteenth embodiment of the light emitting device of the present invention.

FIG. 20 shows a sectional structure of a light emitting diode 10 according to a sixteenth embodiment of the light emitting device of the present invention. The light emitting diode 10 has the same structure as that of the light emitting diode of the first embodiment except that an auxiliary electrode 22 is provided between a substrate 11 and a first conductive type cladding layer 12, and can be used for the same applications as those described in the first embodiment. In this embodiment, parts corresponding to those of the first embodiment are designated by the same reference numerals, and the detailed description thereof is omitted.

The auxiliary electrode 22 for assisting a first electrode 16 functions to uniformly apply a voltage over the entire surface of a light emitting layer 13. The auxiliary electrode 22 has a thickness of 0.2 μm, and is made from a conductive material such as tin oxide ($SnO_2$) If the auxiliary electrode 22 is made from a conductive material having a diffusion preventive function, such as tin oxide, it can serve as the diffusion preventive layer.

The light emitting diode 10 can be produced in accordance with the same procedure as that described in the first embodiment. In addition, the auxiliary electrode 22 is formed by the sputtering process, CVD process, or vacuum vapor-deposition process.

According to the light emitting diode 10, when a specific voltage is applied to the first electrode 16 and the second electrode 17, a current is injected in the micro-crystals 13a of the light emitting layer 13, to generate light emission in the micro-crystals 13a. In this embodiment, since the auxiliary electrode 22 is provided, it is possible to uniformly apply a voltage over the entire surface of the light emitting layer 13, and hence to uniformly generate light emission over the entire surface of the light emitting layer 13.

In this way, according to this embodiment, in addition to the effects obtained by the first embodiment, since the auxiliary electrode 22 is provided, it is possible to uniformly apply a voltage over the entire surface of the light emitting layer 13, and hence to uniformly generate light emission over the entire surface of the light emitting layer 13. It should be noted that this embodiment can be applied to the above-described second to fifteenth embodiments.

Seventeenth Embodiment of Light Emitting Device

Figure 21:
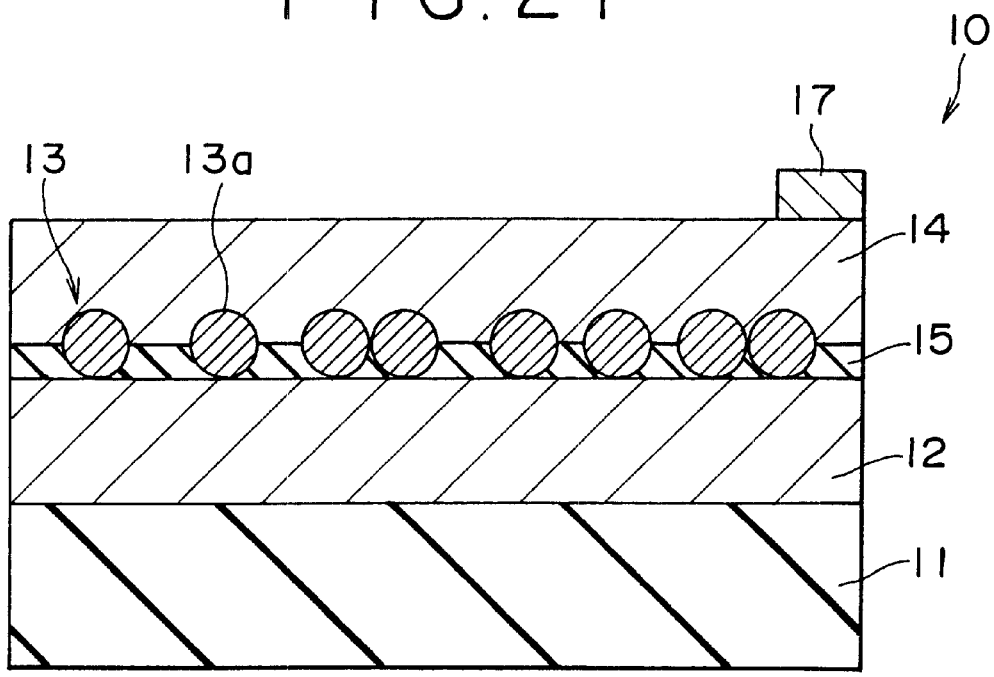
FIG. 21 is a sectional view showing a configuration of a light emitting diode according to a seventeenth embodiment of the light emitting device of the present invention.

FIG. 21 shows a sectional structure of a light emitting diode 10 according to a seventeenth embodiment of the light emitting device of the present invention. The light emitting diode 10 has the same structure as that of the light emitting diode of the first embodiment except that a substrate 11 is made from a conductive material in order to function as a first electrode and instead the first electrode 16 in the first embodiment is omitted. Such a light emitting diode 10 has the same function and effects as those of the light emitting diode according to the first embodiment, and can be used for the same applications as those described in the first embodiment. In this embodiment, parts corresponding to those of the first embodiment are designated by the same reference numerals, and the detailed description thereof is omitted.

The substrate 11 is made from a conductive material such a metal, a semiconductor, or silicon carbide doped with an impurity (doped-SiC). As the metal for forming the substrate 11, a refractory metal such as tungsten (W) or tantalum (Ta) is preferably used because it allows the substrate 11 to be produced at a high temperature, or iron (Fe) is also preferably used because it is inexpensive and easily available and it allows the formation of a device array on the common substrate 11 having a large area. As the semiconductor for forming the substrate 11, silicon is preferably used because it allows the substrate 11 to be produced at a high temperature and it is inexpensive and easily available. The semiconductor used as the material of the substrate 11 is doped with an impurity (n-type impurity in this embodiment) to reduce the resistance thereof. If the substrate 11 is made from a semiconductor or silicon carbide, the semiconductor or silicon carbide may be used in the form of a single crystal body or a non-single crystal body; however, the use of the semiconductor or silicon carbide in the form of the non-single crystal body is preferable because it is easily available, it allows the substrate 11 to be produced at a high temperature, and it allows the formation of a device array on the common substrate 11 having a large area.

In this way, according to this embodiment, in addition to the effects obtained by the first embodiment, since the substrate 11 serves as the first electrode (n-side electrode), it is possible to uniformly apply a voltage over the entire surface of the light emitting layer 13 and hence to uniformly generate light emission over the entire surface of the light emitting layer 13, and to simplify the production steps. In particular, the use of iron as the material of the substrate 11 is advantageous in that it allows the formation of a device array on the common substrate 11 having a large area at a low cost; the use of silicon or silicon carbide as the material of the substrate 11 is advantageous in that it allows the substrate 11 to be inexpensively produced stably even at a high temperature; and the use of silicon or silicon carbide as the material of the substrate 11 is advantageous in that it allows the formation of a device array on the common substrate 11 having a large area. It should be noted that this embodiment can be applied to the above-described second to fifteenth embodiments.

Eighteenth Embodiment of Light Emitting Device

Figure 22:
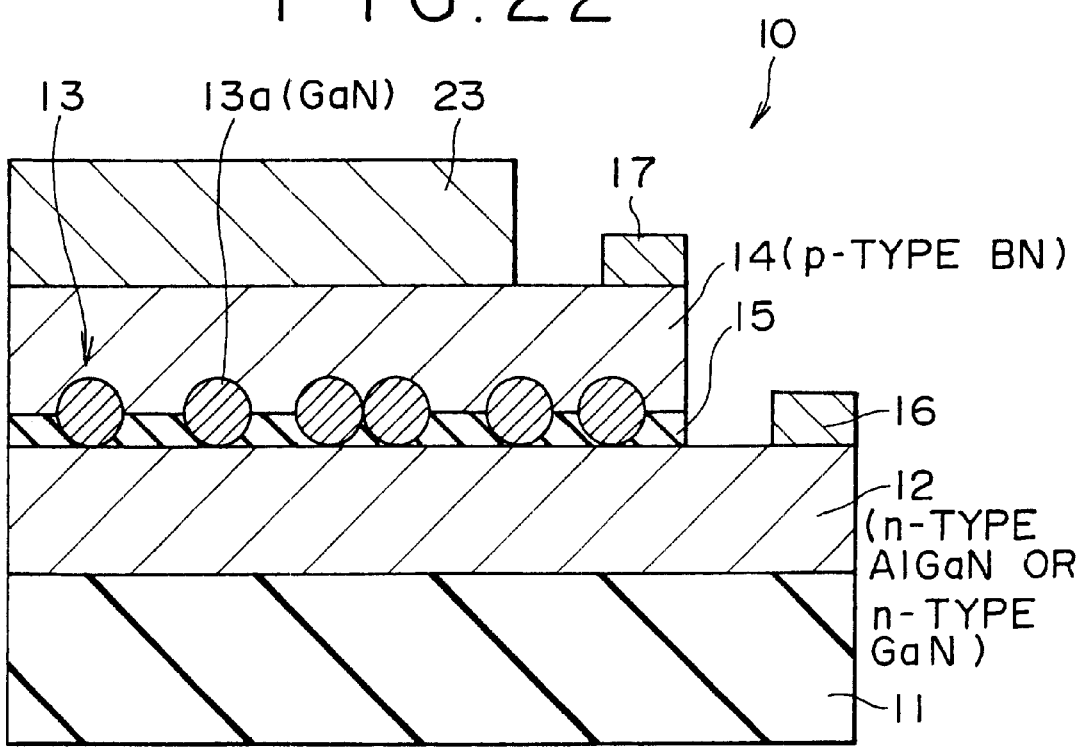
FIG. 22 is a sectional view showing a configuration of a light emitting diode according to an eighteenth embodiment of the light emitting device of the present invention.

FIG. 22 shows a sectional structure of a light emitting diode 10 according to an eighteenth embodiment of the light emitting device of the present invention. The light emitting diode 10 has the same structure as that of the light emitting diode of the first embodiment except that a phosphor layer 23 is provided and a light emitting layer 13 is made from a material different from that of the light emitting layer used in the first embodiment. Such a light emitting diode 10 can be used for the same applications as those described in the first embodiment. In this embodiment, parts corresponding to those of the first embodiment are designated by the same reference numerals, and the detailed description thereof is omitted.

The light emitting layer 13 contains a plurality of micro-crystals 13a made from GaN. The phosphor layer 23 is formed on the side, opposite to a substrate 11, of a second conductive type cladding layer 14. Specific examples of materials for forming the phosphor layer 23 may include an inorganic phosphor material such as $BaMgAl_{10}O_{17}$, to which europium (Eu) is added (hereinafter, referred to as $BaMgAl_{10}O_{17}$: Eu), ZnS to which copper (Cu) and silver (Ag) are added (hereinafter, referred to as ZnS: Cu, Ag), or $YO_2S_2$ to which europium is added (hereinafter, referred to as $YO_2S_2$: Eu); and an organic phosphor material such as coumarin 1, coumarin 6, or rhodamine 101. When excited by ultraviolet rays, such a phosphor material generates light emission. $BaMgAl_{10}O_{17}$: Eu and coumarin 1 each generate light emission of blue; ZnS: Cu, Ag and coumarin 6 each generate light emission of green; and $YO_2S_2$: Eu and rhodamine 101 generate light emission of red.

This light emitting diode 10 can be produced in the same procedure as that described in the first embodiment; however, at the step of forming an insulating layer 15 after formation of the light emitting layer 13, as described in the fourth embodiment, a heating treatment in an oxygen containing atmosphere is preferably performed after a heating treatment in a nitrogen containing atmosphere, and further a heating treatment in a hydrogen containing atmosphere may be performed as needed. In addition, the phosphor layer 23 is formed by the MBE process or laser deposition process.

According to this light emitting diode 10, when a specific voltage is applied to a first electrode 16 and a second electrode 17, light emission is generated at micro-crystals 13a of the light emitting layer 13. The phosphor layer 23 is irradiated with light having been generated in the light emitting layer 13, to generate light of color depending on the phosphor material due to excitation.

In this way, according to this embodiment, in addition to the effects obtained by the first embodiment, since the phosphor layer 23 is provided, it is possible to easily change the color of light emission by changing the phosphor material of the phosphor layer 23. As a result, it is possible to extend the selection range of the material and also to extend the range of colors of light emission. It should be noted that this embodiment can be applied to the above-described second to seventeenth embodiments.

Nineteenth Embodiment of Light Emitting Device

Figure 23:
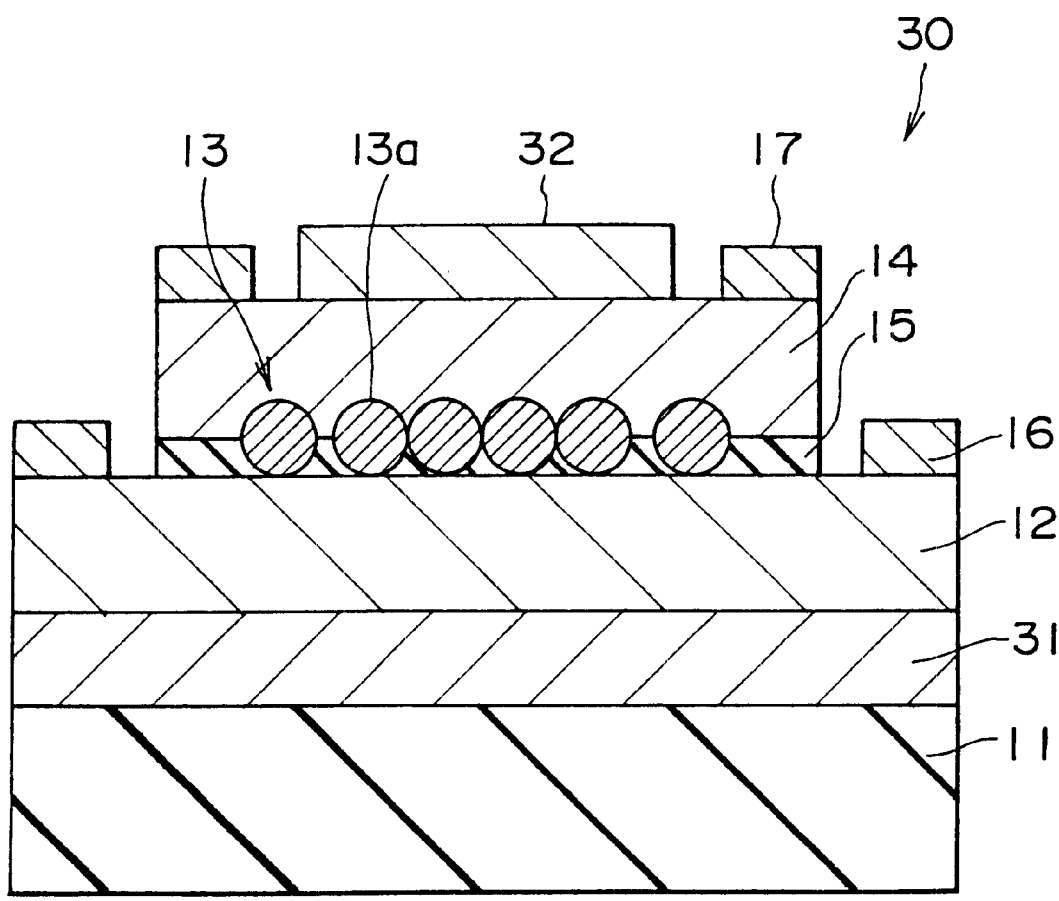
FIG. 23 is a sectional view showing a configuration of a light emitting diode according to a nineteenth embodiment of the light emitting device of the present invention.

FIG. 23 shows a sectional structure of a semiconductor laser (LD) according to a nineteenth embodiment of the light emitting device of the present invention. The semiconductor laser 30 has the same structure and effects as those of the light emitting diode 10 of the first embodiment except that a pair of reflectors 31 and 32. In this embodiment, parts corresponding to those of the first embodiment are designated by the same reference numerals, and the detailed description thereof is omitted.

The reflector 31 is formed between a substrate 11 and a first conductive type cladding layer 12, and the reflector 32 is formed on the side, opposite to the substrate 11, of a second conductive type cladding layer 14. While not shown, each of the reflectors 31 and 32 is formed of one or more low refractive index layers and one or more high refractive index layers alternatively stacked, or formed of one kind of the layers. The refractive index of each of the reflectors 31 and 32 is controlled in accordance with the stacked number of the low refractive index layers and the high refractive index layers. The refractive index of the reflector 31 is lower than that of the reflector 32. Accordingly, light is amplified while being propagated reciprocatedly between the pair of reflectors 31 and 32, and finally goes out of the reflector 32. Specific examples of the materials for forming the low refractive index layer may include silicon dioxide ($SiO_2$), calcium fluoride (CaF), and magnesium fluoride ($MgF_2$), and specific examples of the materials for forming the high refractive index layer may include cerium oxide ($CeO_2$), zinc sulfide (ZnS), hafnium oxide ($HfO_2$), and tantalum oxide ($TaO_2$).

The semiconductor laser 30 can be produced in accordance with the same procedure as that described in the first embodiment, for example, by the sputtering process or CVD process.

According to this semiconductor laser 30, when a specific voltage is applied to a first electrode 16 and a second electrode 17, a current is injected in micro-crystals of a light emitting layer 13, to generate light emission at the micro-crystals 13a. The light generated by the light emitting layer 13 is amplified while being propagated reciprocatedly between the pair of reflectors 31 and 32, and finally goes out of the reflector 32.

In this way, the present invention can be applied not only to light emitting diodes but also to semiconductor lasers. It should be noted that this embodiment can be applied not only to the first embodiment but also to the second to eighteenth embodiment.

First Embodiment of Light Emitting Apparatus

Figure 24:
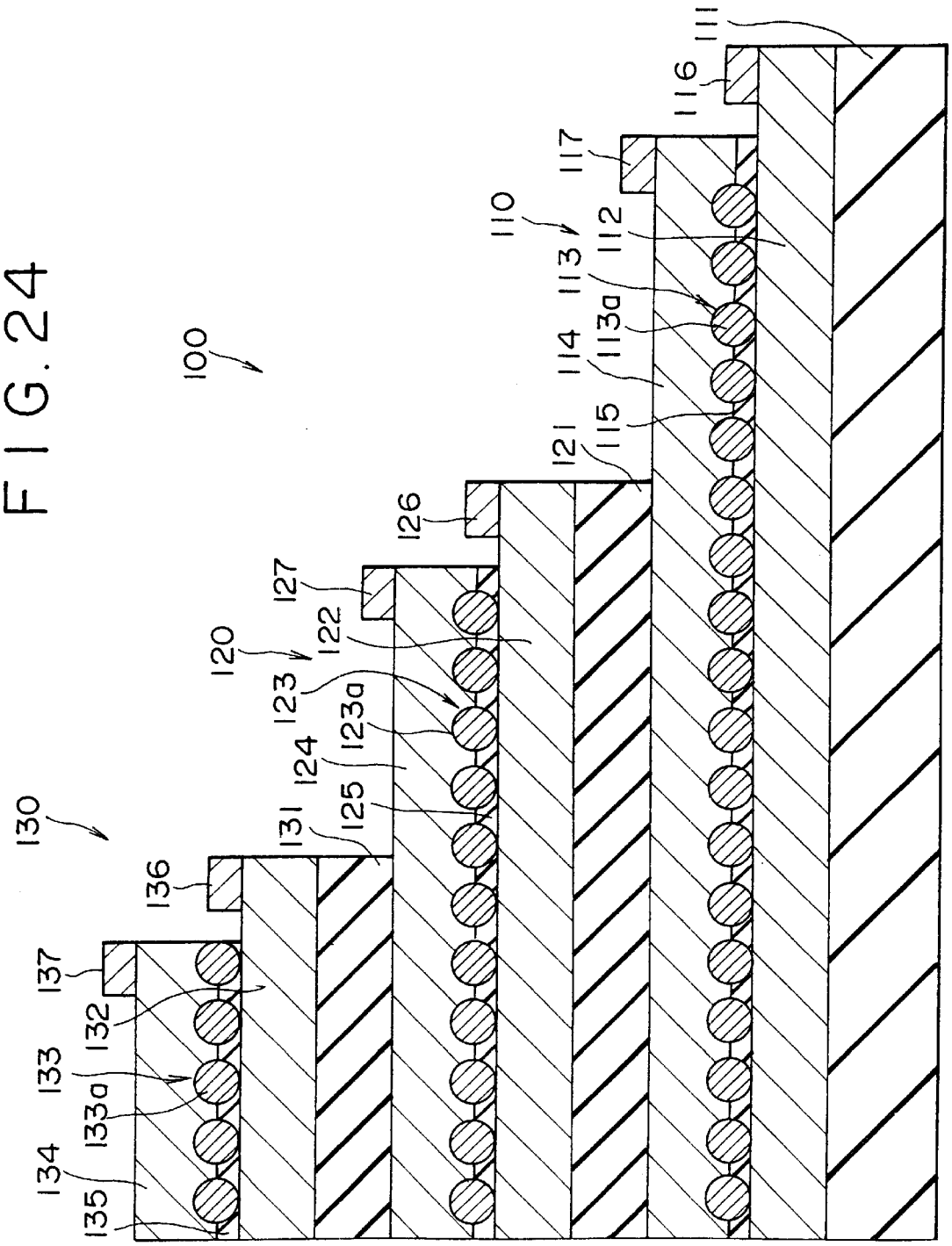
FIG. 24 is a sectional view showing a configuration of a first embodiment of a light emitting apparatus of the present invention.

FIG. 24 is a sectional structure of a first embodiment of a light emitting apparatus of the present invention. A light emitting apparatus 100 has a structure in which a plurality of light emitting diodes 110, 120 and 130 are sequentially stacked on a common substrate 111 with insulating portion films 121 and 131 put between the diodes 110 and 120 and between the diodes 120 and 130, respectively. Each of the light emitting diodes 110, 120 and 130 has the same structure as that of the light emitting diode according to the first embodiment of the light emitting device except for materials for forming light emitting layers 113, 123, and 133. Accordingly, parts of the light emitting diodes 110, corresponding to those of the light emitting diode 10 of the first embodiment, are designated by adding "100" to the reference numerals of the corresponding parts of the light emitting diode 10, and parts of the light emitting diodes 120 or 130, corresponding to those of the light emitting diode 110, are designated by adding "10" or "20" to the reference numerals of the corresponding parts of the light emitting diode 100. In this embodiment, the detailed description of the parts corresponding to those in the first embodiment is omitted.

The light emitting layers 113, 123, and 133 contain micro-crystals 113a, 123a, and 133a made from different materials, respectively. For example, the light emitting layer 113 contains the micro-crystals 113a made from InN; the light emitting layer 123 contains the micro-crystals 123a made from ZnO; and the light emitting layer 133 contains the micro-crystals 133a made from GaN. With this configuration, the light emitting diode 110 generates light emission of red, the light emitting diode 120 generates light emission of green, and the light emitting diode 130 generates light emission of blue. It should be noted that the light emission generated by the light emitting diode 120 is due to donor-acceptor pair emission resulting from transition between levels of the donor and acceptor, and the light emission generated from each of the light emitting diodes 110 and 130 is due to between-band emission resulting from transition between band gaps.

The light emitting diode 110 directly stacked on the substrate 111 is largest, the light emitting diode 120 stacked on the light emitting diode 110 is smaller than the light emitting diode 110, and the light emitting diode 130 stacked on the light emitting diode 120 is smaller than the light emitting diode 120. A portion of the lower light emitting diode (for example, light emitting diode 110), not covered with the upper light emitting diode(s) (for example, the light emitting diodes 120 and 130), constitutes a light emission plane. Each of the insulating portion films 121 and 131 is made from silicon dioxide ($SiO_2$).

The light emitting apparatus 100 configured as described above is produced in accordance with the following procedure:

Like the first embodiment of the light emitting device, a first conductive type cladding layer 112 is formed on one plane of a substrate 111, and a light emitting layer 113 is formed thereon. The resultant structure is subjected to a heating treatment in a nitrogen containing atmosphere and a heating treatment in an oxygen containing atmosphere, to form an insulating layer 115. These heating treatments are followed by a heating treatment in a hydrogen containing atmosphere, as needed. Then, like the first embodiment of the light emitting device, a second conductive type cladding layer 114 is formed on the light emitting layer 113 and the insulating layer 115.

After formation of the second conductive type cladding layer 114, an insulating portion film 121 is formed by the CVD process. After that, a first conductive type cladding layer 122, a light emitting layer 123, an insulating film 125, and a second conductive type cladding layer 124 are similarly formed on the insulating portion film 121. In this case, at the step of forming the insulating layer 125, the heating treatment in the nitrogen containing atmosphere is not performed. Then, an insulating portion film 131 is formed on the second conductive type cladding layer 124. After that, a first conductive type cladding layer 132, a light emitting layer 133, an insulating layer 135, and a second conductive type cladding layer 134 are similarly formed on the insulating portion film 131.

After formation of the plurality of layers from the first conductive type cladding layer 112 to the second conductive type cladding layer 134, the second conductive type cladding layers 134, 124 and 114, insulating layers 135, 125, 115, light emitting layers 133, 123, 113, first conductive type cladding layers 132 and 122, and insulating portion films 131 and 121 are selectively removed by lithography and etching, and first electrodes 116, 126 and 136 and second electrodes 117, 127 and 137 are formed, respectively. In this way, a light emitting apparatus 100 shown in FIG. 24 is produced.

According to the light emitting apparatus 100, when specific voltages are applied between the first electrodes 116, 126 and 136 and the second electrode 117, 127 and 137, light emission is generated at the micro-crystals 113a, 123a, and 133a. Since the-micro-crystals 113a, 123a, and 133a are made from the above-described different materials, the light emitting diodes 110, 120, and 130 generate three kinds of light emission of red, green and blue, respectively.

In this way, according to the light emitting apparatus 100 of this embodiment, since the light emitting diodes 110, 120, and 130 are sequentially stacked on the substrate 111, it is possible to form the plurality of light emitting diodes 110, 120, and 130 allowing different kinds of light emission on the common substrate 111. Accordingly, a color display unit using the light emitting apparatus 100 is advantageous in that pixels can be finer than those in a color display unit in which a plurality of light emitting diodes allowing different kinds of light emission are horizontally arranged on a plane.

In this light emitting apparatus, each of the light emitting diodes 110, 120, 130 may be replaced with a light emitting diode having the same structure as that of the light emitting diode of each of the second to nineteenth embodiment of the light emitting device.

First Embodiment of Display Unit

Figure 25:
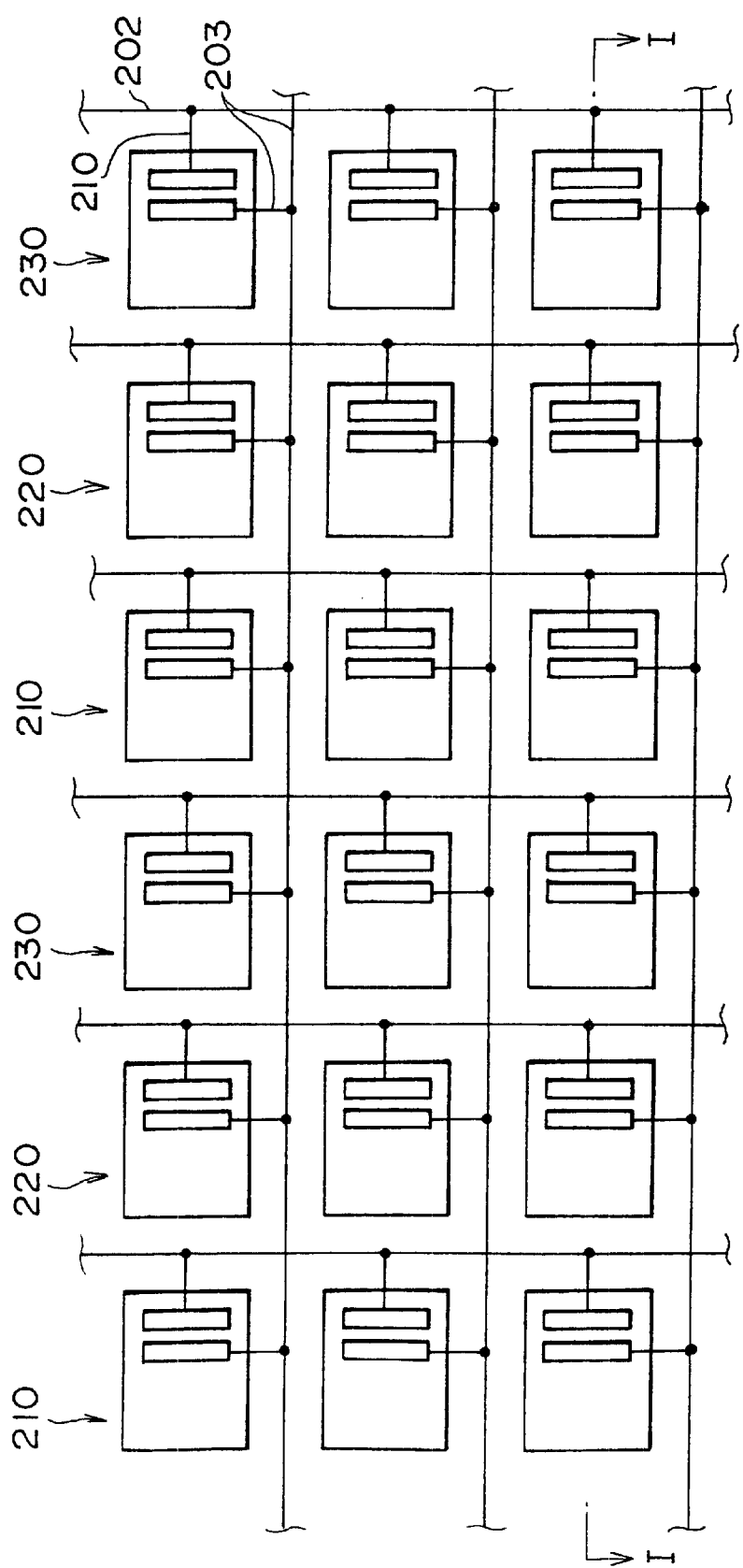
FIG. 25 is a schematic diagram showing a configuration of a first embodiment of a display unit of the present invention.

FIG. 25 is a diagram showing a schematic configuration of a first embodiment of a display unit of the present invention. This display unit includes a plurality of light emitting diodes 210 allowing light emission of red, a plurality of light emitting diodes 220 allowing light emission of green, and a plurality of light emitting diodes 230 allowing light emission of blue. The light emitting diodes 210, 220, and 230 are formed on a common substrate 211 in such a manner as to be disposed in an array of M-rows×N-columns (M and N are each an integer of 2 or more). In this array, the light emitting diodes 210 (220, 230) disposed on the same column allow light emission of red (green, blue), and the light emitting diodes 210, 220, and 230 disposed on the same row allow light emission of red, green and blue which are repeated in this order.

Figure 26:
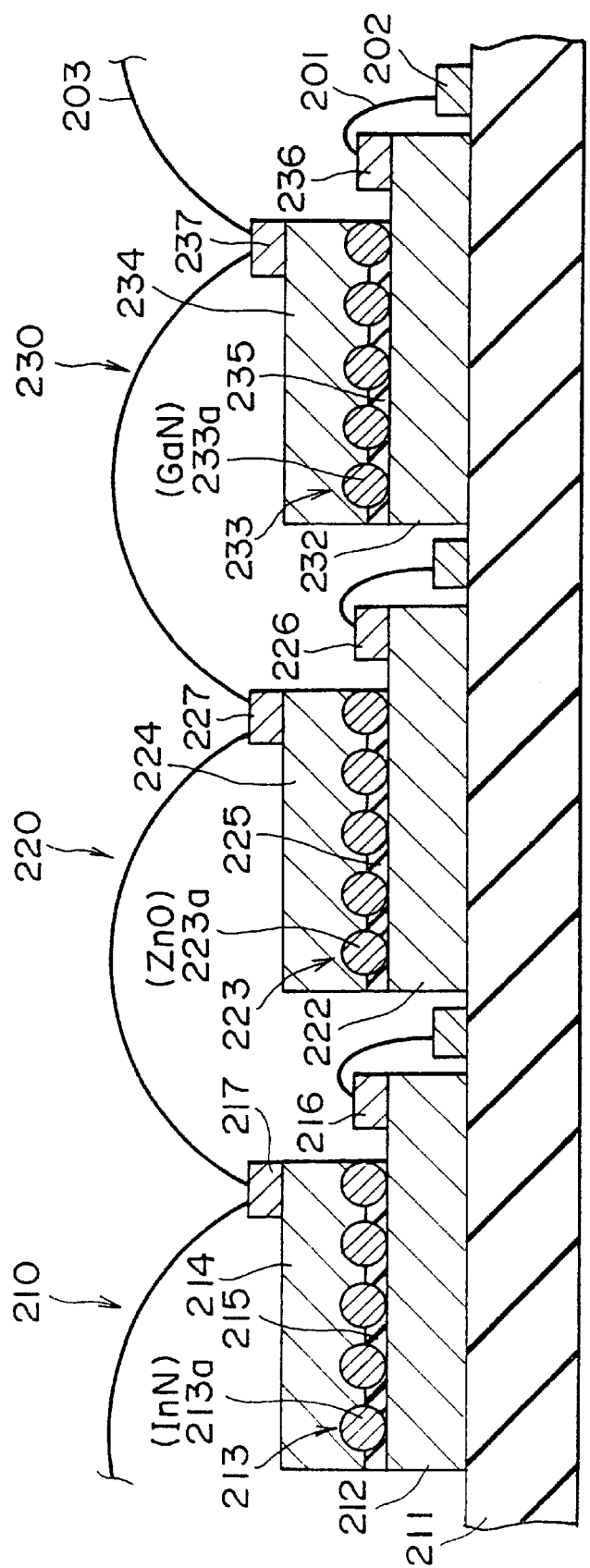
FIG. 26 is a sectional view taken on line I—I of the display unit shown in FIG. 25.

FIG. 26 shows a sectional structure taken on line I—I of FIG. 25. The light emitting diodes 210, 220, and 230 have each the same structure as that of the light emitting diode according to the first embodiment of the light emitting except that light emitting layers 213, 223 and 233 are made from different materials. Accordingly, parts of the light emitting diodes 210, corresponding to those of the light emitting diode 10 of the first embodiment, are designated by adding "200" to the reference numerals of the corresponding parts of the light emitting diode 10, and parts of the light emitting diodes 220 or 230, corresponding to those of the light emitting diode 210, are designated by adding "10" or "20" to the reference numerals of the corresponding parts of the light emitting diode 210. In this embodiment, the detailed description of the parts corresponding to those in the first embodiment is omitted.

The light emitting layers 213, 223, and 233 contain micro-crystals 213a, 223a, and 233a made from different materials, respectively. For example, the light emitting diode 210 contains the micro-crystals 213a made from InN; the light emitting diode 220 contains the micro-crystals 223a made from ZnO; and the light emitting diode 230 contains the micro-crystals 233a made from GaN. First electrodes 216, 226, and 236 are connected via wires 201 to common wiring patterns 202 extending in the column direction, and the second electrodes 217, 227, and 237 are connected to a wire 203 as a common wiring pattern extending in the row direction.

The display unit configured as described above can be produced in accordance with the following procedure:

First, like the first embodiment of the light emitting device, a first conductive type forming layer for forming first conductive type cladding layers 212, 222, and 232 is formed on one layer of a substrate 211. A portion, other than a region for forming a light emitting diode 210, of the first conductive type forming layer is covered with a mask, and like the first embodiment of the light emitting device, a light emitting layer 213 is formed on the first conductive type forming layer. The formation of the light emitting layer 213 is followed by a heating treatment in a nitrogen containing atmosphere and a heating treatment in an oxygen containing atmosphere, to form an insulating layer 215. The heating treatment in the oxygen containing atmosphere is followed by a heating treatment in a hydrogen containing atmosphere, as needed. Then, a portion to be covered with the mask is shifted, and a light emitting layer 223, an insulating layer 225, a light emitting layer 233, and an insulating layer 235 are sequentially formed. At the step of forming the insulating layer 225, the heating treatment in the nitrogen containing atmosphere is not performed.

After the formation of the light emitting layers 213, 223, and 233 and the insulating layers 215, 225, and 235, like the first embodiment of the light emitting device, a second conductive type forming layer for forming second conductive type cladding layers 214, 224, and 234 is formed over the entire surface. After the formation of the second conductive type forming layer, the layers thus stacked are selectively removed by lithography and etching, to form first conductive type cladding layers 212, 222, and 223 and second conductive type cladding layers 214, 224, and 234. After that, first electrodes 216, 226 and 236, second electrodes 217, 227, and 237, and common wiring patterns 202 extending in the column direction are formed. The first electrodes 216, 226, and 236 are connected to the common wiring patterns 202 via wires 201, and the second electrodes 217, 227, and 237 are connected to a wire 203 as a common wiring pattern. In this way, the display unit shown in FIGS. 25 and 26 is produced.

According to this display unit, when specific voltages are applied between the first electrodes 216, 226, and 236 and the second electrodes 217, 227, and 237, light emission is generated at the micro-crystals 213a, 223a, and 233a. As a result, the light emitting diodes 210, 220, and 230 generate three kinds of light emission of red, green, and blue, respectively.

In this way, according to the display unit of this embodiment, since the display unit adopts the light emitting diodes of the present invention, it is possible to use, as the common substrate, the substrate 211 made from an amorphous material such as glass, and hence to form a device array on the common substrate 211 having a large area.

Second Embodiment of Display Unit

Figure 27:
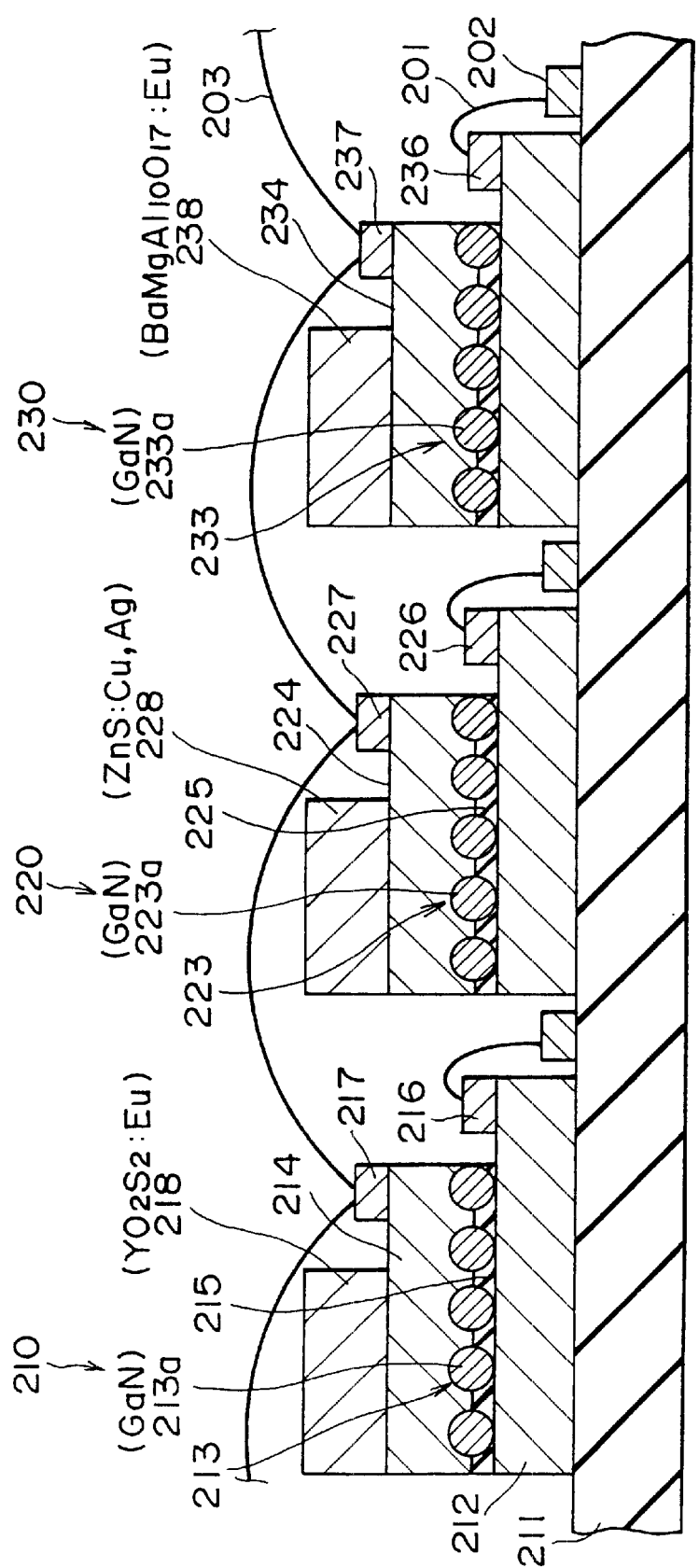
FIG. 27 is a sectional view showing a configuration of a second embodiment of the display unit of the present invention.

FIG. 27 shows a sectional structure of a second embodiment of the display unit of the present invention. This display unit has the same structure as that of the display unit according to the first embodiment except that phosphor layers 218, 228, and 238 are provided on second conductive type cladding layers 214, 224, and 234, respectively and light emitting layers 213, 223, and 233 are made from different materials. In this embodiment, parts corresponding to those in the first embodiment are designated by the same reference numerals, and the detailed description thereof is omitted.

Light emitting layers 213, 223, and 233 contain pluralities of micro-crystals 213a, 223a, and 233a made from GaN, respectively. The phosphor layer 218 of the light emitting diode 210 is made from $YO_2S_2$: Eu; the phosphor layer 228 of the light emitting diode 220 is made from ZnS: Cu, Ag; and the phosphor layer 238 of the light emitting diode 230 is made from $BaMgAl_{10}O_{17}$: Eu.

This display unit can be produced in accordance with the same procedure as that for the display unit of the first embodiment. Since the light emitting layers 213, 223, and 233 are made from the same material, that is, GaN, they can be simultaneously formed without use of any mask. The phosphor layers 218, 228, and 238 are formed by the MBE process or laser deposition process. This display unit has the same function as that of the display unit of the first embodiment, except that the phosphor layers 218, 228, and 238 are irradiated with light rays generated by the light emitting layers 213, 223, and 233, to generate light of colors corresponding to the phosphor materials thereof.

In this way, according to this embodiment, in addition to the effects obtained by the first embodiment, since the phosphor layers 218, 228, and 238 are provided, it is possible to obtain the light emitting diodes 210, 220, and 230 allowing light emission of different colors easily changeable depending on the phosphor materials of the phosphor layers 218, 228, and 238, and hence to easily form, on the same substrate, the light emitting diodes 210, 220, and 230 allowing light emission of different colors.

Third Embodiment of Display Unit

Figure 28:
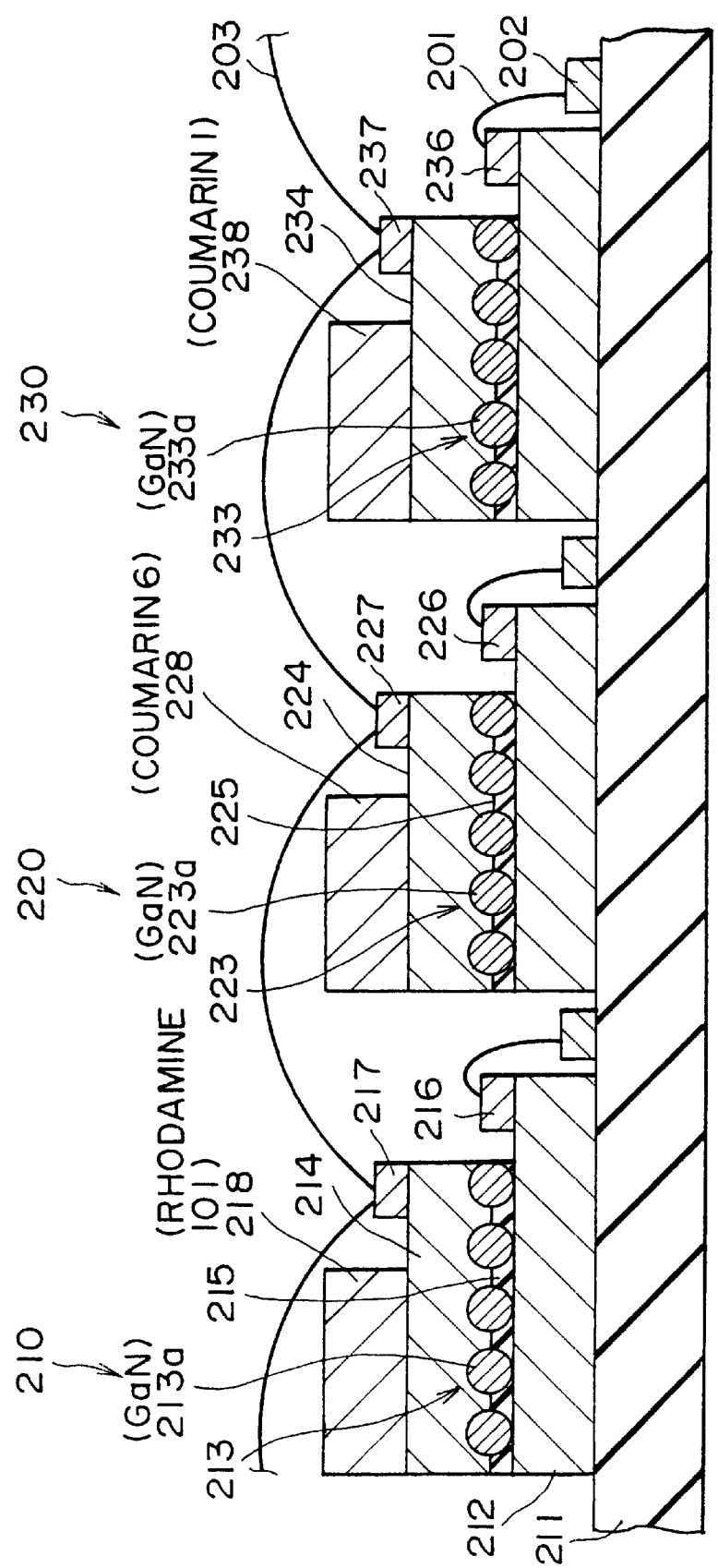
FIG. 28 is a sectional view showing a configuration of a third embodiment of the display unit of the present invention.

FIG. 28 shows a sectional structure of a third embodiment of the display unit of the present invention. This display unit is different from the display unit of the second embodiment except for materials for forming phosphor layers 218, 228, and 238. In this embodiment, parts corresponding to those in the second embodiment are designated by the same reference numerals, and the detailed description thereof is omitted.

In this embodiment, the phosphor layer 218 is made from rhodamine 101; the phosphor layer 228 is made from coumarin 6; and the phosphor layer 238 is made from coumarin 1. This display unit can be produced in accordance with the same procedure for producing the display unit of the second embodiment, and has the same function and effects as those of the display unit of the second embodiment.

Fourth Embodiment of Display Unit

Figure 29:
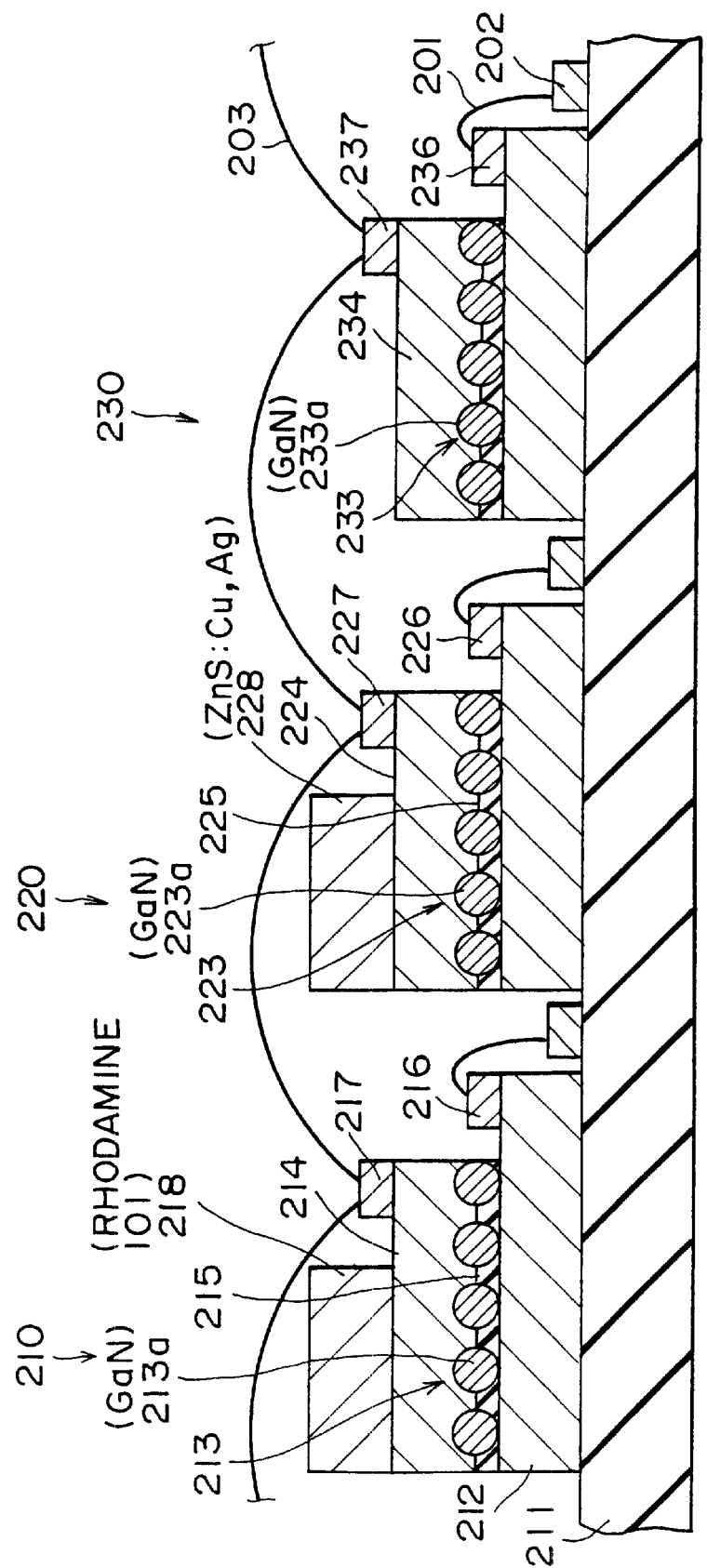
FIG. 29 is a sectional view showing a configuration of a fourth embodiment of the display unit of the present invention.

FIG. 29 shows a sectional structure of a fourth embodiment of the display unit of the present invention. This display unit has the same structure as that of the display unit of the first embodiment, except that phosphor layers 218 and 228 are provided on second conductive type cladding layers 214 and 224 of light emitting diodes 210 and 220, and light emitting layers 213 and 223 are made from materials different from those of the light emitting layers 213 and 223 in the first embodiment. That is to say, this display unit is intended to generate light emission of red and green from the phosphor layers 218 and 228, and generate light emission of blue from micro-crystals 233a made from GaN. This display unit has the same effects as those obtained by the display unit of the first embodiment. In this embodiment, parts corresponding to those in the second embodiment are designated by the same reference numerals, and the detailed description thereof is omitted.

The light emitting layers 213 and 223 contain pluralities of micro-crystals 213a and 223a made from GaN, respectively. The grain size of each of these micro-crystals 213a and 223a is smaller than that of each of micro-crystals 233a of a light emitting layer 233 which is the same as the light emitting layer 233 of the first embodiment. The light emitting layers 213 and 223 generate ultraviolet rays which excite the phosphor layers 218 and 228, respectively. The phosphor layer 218 is made from rhodamine 101 and the phosphor layer 228 is made from ZnS: Cu, Ag.

This display unit can be produced in accordance with the same procedure as that for the display unit of the first embodiment. Phosphor layers 218 and 228 are formed by the MBE process or laser deposition process. This display unit has the same function as that of the display unit of the first embodiment, except that the phosphor layers 218 and 228 are irradiated with light rays generated by light emitting layers 213 and 223, respectively, to generate light emission of colors corresponding to the phosphor materials thereof.

Fifth Embodiment of Display Unit

Figure 30:
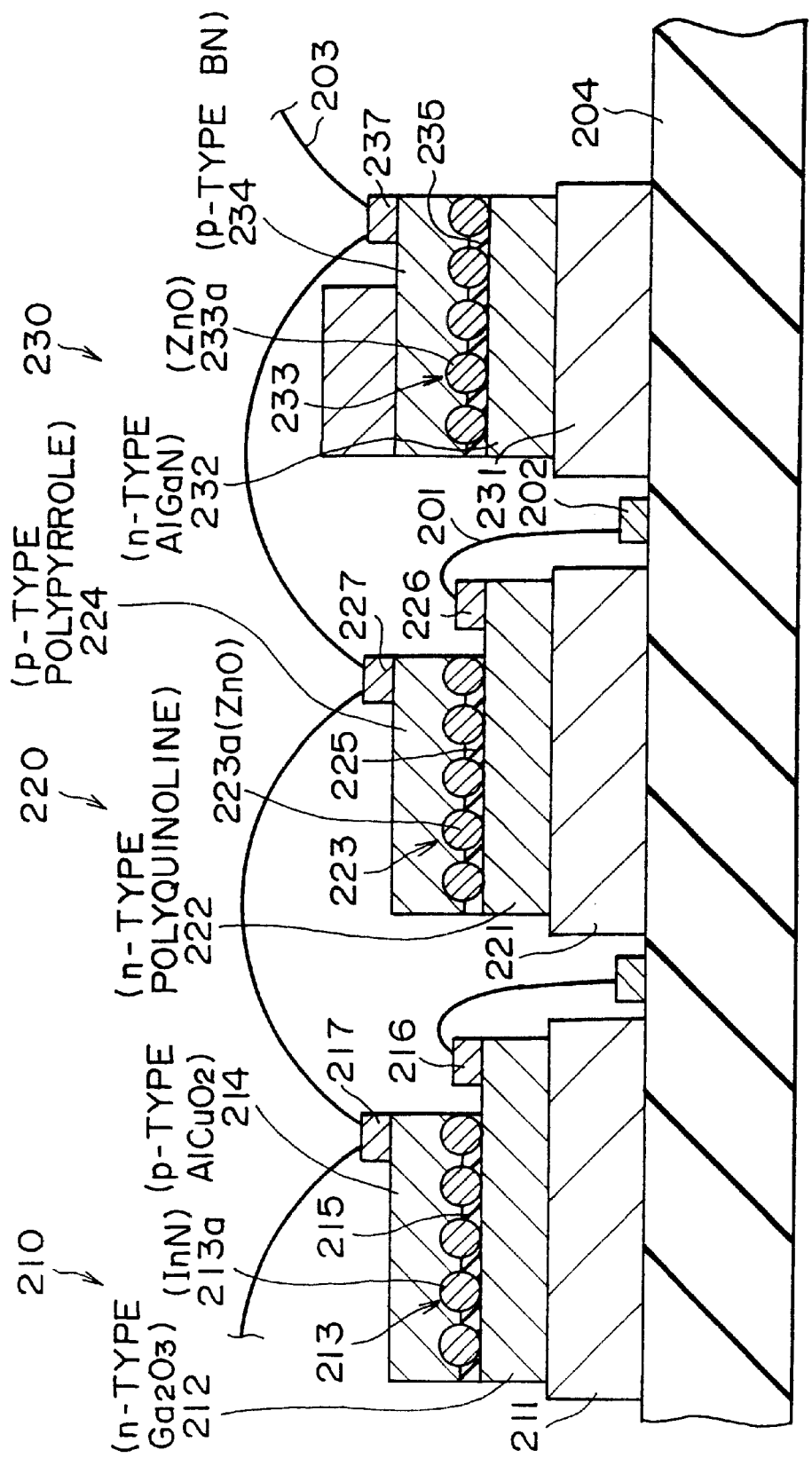
FIG. 30 is a sectional view showing a configuration of a fifth embodiment of the display unit of the present invention.

FIG. 30 shows a sectional structure of a fifth embodiment of the display unit of the present invention. This display unit has the same structure as that of the display unit of the first embodiment, except that each column of light emitting diodes 210 (220, 230) allowing light emission of the same color are formed on a common substrate 211 (221, 231), and the configuration of each of the light emitting diodes 210, 220 and 230 is partially different from that of each of the light emitting diodes 210, 220, 230 of the first embodiment. In this embodiment, parts corresponding to those in the first embodiment are designated by the same reference numerals, and the detailed description thereof is omitted.

The light emitting diode 210 has the same configuration as that of the light emitting diode of the first embodiment of the light emitting device except for the materials for forming components of the light emitting diode 210. A substrate 211 is made from glass. A first conductive type cladding layer 212 is made from an n-type $Ga_2O_3$ doped with an n-type impurity such as aluminum. A light emitting layer 213 contains a plurality of micro-crystals 213a made from InN. A second conductive type cladding layer 214 is made from $AlCuO_2$. An insulating layer 215 is made from a compound of aluminum, gallium, and nitrogen. A first electrode 216 is formed by sequentially stacking a chromium layer, a nickel layer, and a gold layer on the first conductive type cladding layer 212, and alloying them by heating. A second electrode 217 is formed by sequentially stacking a nickel layer, a platinum layer, and a gold layer on the second conductive type cladding layer 214, and alloying them by heating.

The light emitting diode 220 has the same configuration as that of the light emitting diode of the first embodiment of the light emitting device except for materials for forming components of the light emitting diode 220. A substrate 221 is made from a plastic material. A first conductive type cladding layer 222 is made from an n-type polyquinoline to which an n-type additive such as lithium is added. A light emitting layer 223 contains a plurality of micro-crystals 223a made from ZnO. A second conductive type cladding layer 224 is made from polypyrrole to which a p-type additive such as iron chloride is added. An insulating layer 225 is made from polyimide. A first electrode 226 is made from tin oxide. A second electrode 227 is made from a compound of aluminum and lithium.

The light emitting diode 230 has the same configuration as that of the light emitting diode of the first embodiment of the light emitting device except that a phosphor layer 238 is provided, materials for forming components of the diode 230 are different from those of the diode of the first embodiment of the light emitting device, and the first electrode in the first embodiment is omitted. A substrate 231 is made from a metal such as aluminum, copper, silver, stainless steel, or brass, which serves as a first electrode. A first conductive type cladding layer 232 is made from n-type AlGaN or n-type GaN doped with an n-type impurity such as silicon. A light emitting layer 233 contains a plurality of micro-crystals 233a made from ZnO. A second conductive type cladding layer 234 is made from p-type BN doped with a p-type impurity such as magnesium. An insulating layer 235 is made from a compound of aluminum, gallium, and oxygen. A second electrode 237 is formed by sequentially stacking a nickel layer, a platinum layer, and a gold layer on the second conductive type cladding layer 234, and alloying them by heating.

Each column of the light emitting diodes 210 (220, 230) are formed on a common substrate 211 (221, 231). These substrates 211, 221, and 231 are mounted on a mounting substrate 204. Common wiring patterns 202 extending in the column direction are formed on the mounting substrate 204. The first electrodes 216 and 226 of the light emitting diodes 210 and 220 are connected to the common wiring patterns 202 via wires 201. With respect to the light emitting diode 230, the substrate 231 is used as the common wiring pattern 202 extending in the column direction.

The display unit configured as described above can be produced in accordance with the following procedure:

The light emitting diodes 210, 220, and 230 are produced in accordance with the same procedure as that for the display unit of the first embodiment. In addition, first conductive type cladding layer 222, second conductive type cladding layer 224, and insulating layer 225 of the light emitting diode 220, each of which is made from the organic material, are formed by the coating process, vacuum vapor-deposition process, or laser deposition process. Then, the light emitting diodes 210, 220, and 230 are divided from each other along lines extending in the column direction, and are mounted on the mounting substrate 204. First electrodes 216 and 226 are connected to common wiring patterns 202 via wires 201, and second electrodes 217, 227, and 237 are connected to a wire 203 as a common wiring pattern. In this way, the display unit shown in FIG. 30 is produced.

This display unit has the same function as that of the display unit of the first embodiment except that the light emitting diode 230 makes use of light emission from the phosphor layer 238. In this way, according to the display unit of this embodiment, since it uses the light emitting diode of the present invention, the substrate 211 (221, 231) can be used commonly to each column of the light emitting diodes 210 (220, 230). In addition, the substrate can be used commonly to each row of the light emitting diodes. Since the substrate 231 of the light emitting diode 230 is made from the metal, it can be used as the common wiring pattern 202. As a result, it is possible to simplify the configuration of the display unit and to facilitate the production of the display unit.

Sixth Embodiment of Display Unit

Figure 31:
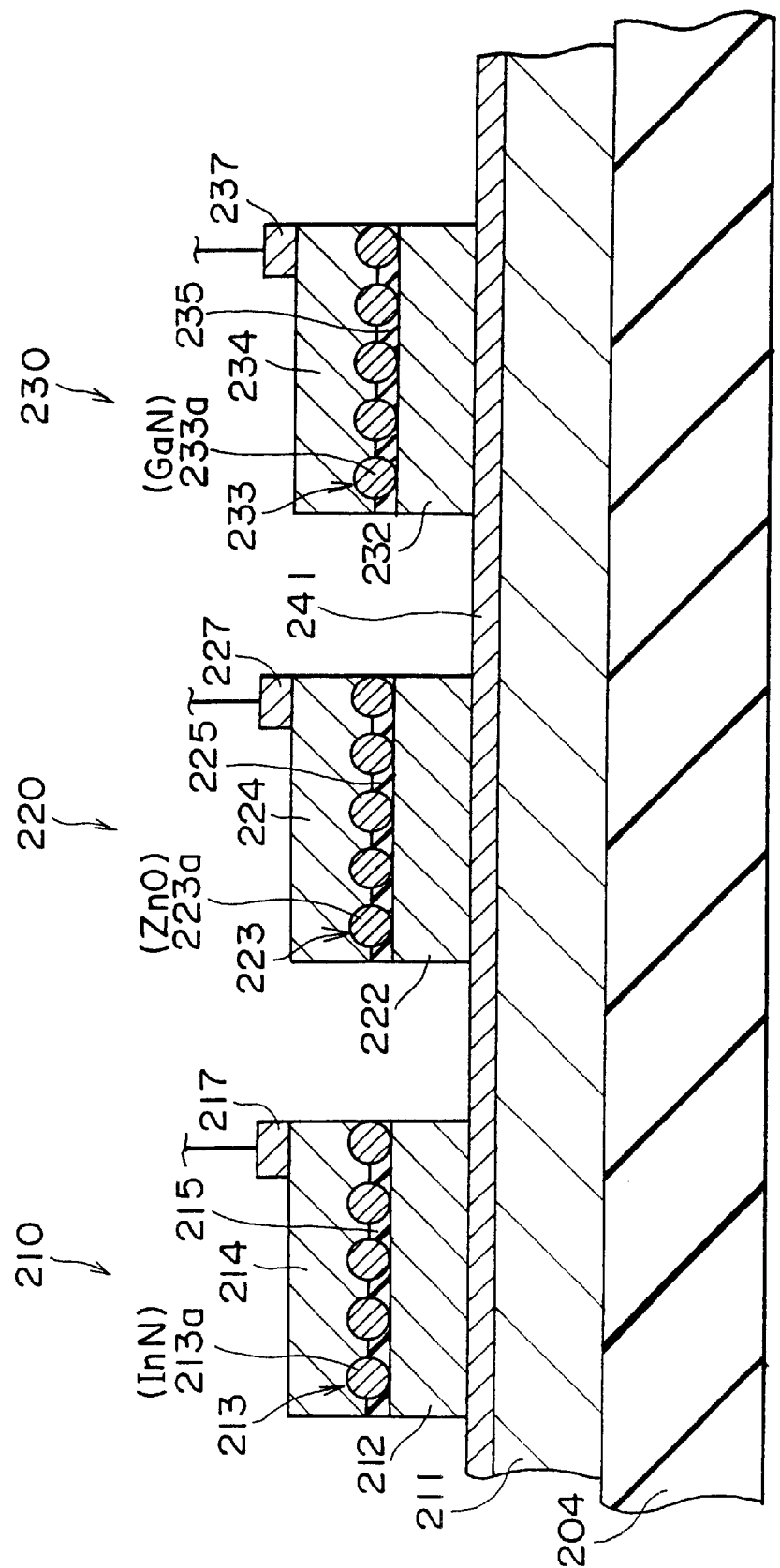
FIG. 31 is a sectional view showing a configuration of a sixth embodiment of the display unit of the present invention.

FIG. 31 shows a sectional structure of a sixth embodiment of the display unit of the present invention. This display unit has the same structure as that of the display unit of the first embodiment, except that a substrate 211 is made from a conductive material and is used commonly to each column or each row of light emitting diodes, and a diffusion preventive layer 241 is provided between the substrate 211 and each of first conductive type cladding layers 212, 222, and 232. This display unit has the same function as that of the display unit of the first embodiment, and can be produced in accordance with the same procedure as that for the display unit of the first embodiment. In this embodiment, parts corresponding to those in the first embodiment are designated by the same reference numerals, and the detailed description thereof is omitted.

The substrate 211 is made from a metal such as aluminum, copper, silver, stainless steel, or brass, which serves as a first electrode and a common wiring pattern extending in the row direction. The diffusion preventive layer 241 is made from tin oxide. Each row of the light emitting diodes 210 (220, 230), or each column of the light emitting diodes 210, 220, and 230 are disposed on the common substrate 211 which is then mounted on a mounting substrate 204. Second electrodes 217, 227, and 237 are connected to a wire 203 for each row or each column. It should be noted that in the example shown in FIG. 31, each row of the light emitting diodes 210, 220 and 230 are disposed on the common substrate 211.

In this way, according to the display unit of this embodiment, since it uses the light emitting diode of the present invention, the substrate 211 can be made from the metal as described in the fifth embodiment and thereby it can be used as the common wiring pattern, with a result that it is possible to simplify the configuration of the display unit and facilitate the display unit.

Seventh Embodiment of Display Unit

Figure 32:
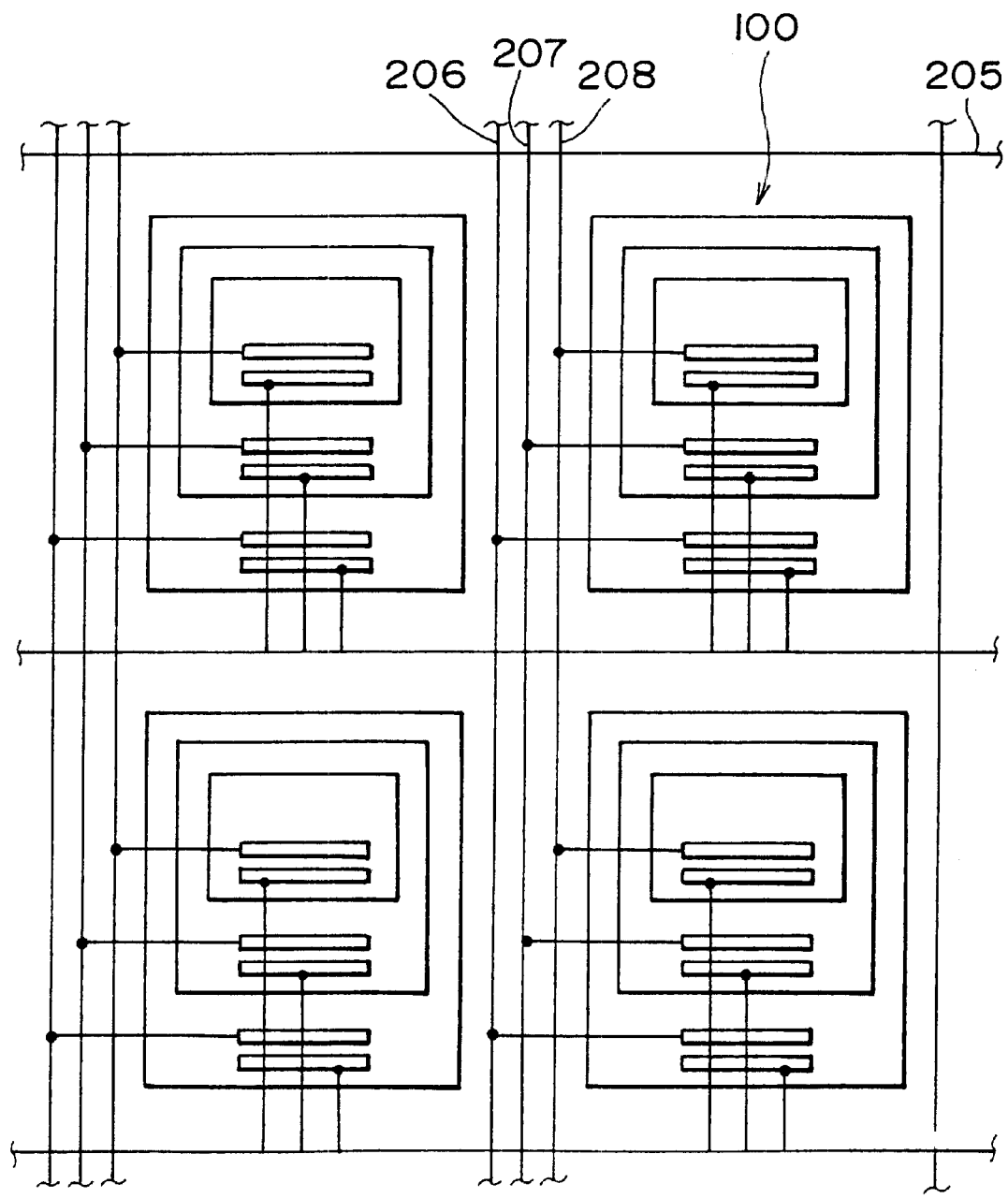
FIG. 32 is a schematic diagram showing a configuration of a seventh embodiment of the display unit of the present invention.

FIG. 32 shows a schematic configuration of a seventh embodiment of the display unit of the present invention. This display unit includes a plurality of the light emitting apparatuses 100 of the present invention. These light emitting apparatuses 100 are formed on a common substrate 111 in such a manner as to be disposed in an array. Each row or each column of the light emitting apparatuses 100 may be formed on the common substrate 111; or each of the light emitting apparatuses 100 may be formed on the substrate 111. If the light emitting apparatuses 100 are formed on a plurality of the substrates 111 as described above, the substrates 111 are mounted on a mounting substrate (not shown) in such a manner that the light emitting apparatuses 100 are disposed in an array. First electrodes 116, 126, and 136 of each light emitting apparatus 100 are connected via wires to a common wiring pattern 205 formed on the substrate 111 or mounting substrate in such a manner as to extend in the row direction, and second electrodes 117, 127, and 137 are respectively connected via wires to common wiring patterns 206, 207, and 208 formed on the substrate 111 or mounting substrate in such a manner as to extend in the column direction.

In this way, according to the display unit of this embodiment, since it uses the light emitting apparatus of the present invention, it is possible to make finer pixels as compared with the display unit described in each of the first to sixth embodiments in which the light emitting diodes allowing light emission of different colors are disposed on a plane, and hence to obtain a high precision color display unit.

While the preferred embodiments of the present invention have been described, such description is for illustrative purposes only, and it is to be understood that various changes may be made without departing from the scope of the present invention. For example, according to the present invention, the materials for forming the first conductive type cladding layer, light emitting layer, second conductive type cladding layer, and insulating layer are not limited to those described in the above-described embodiments. Concretely, the light emitting layer may be made from a II–VI compound semiconductor containing at least one kind of group II elements selected from a group consisting of zinc, magnesium, cadmium (Cd), manganese (Mn), mercury (Hg), and beryllium (Be), and at least one kind of group VI elements selected from a group consisting of oxygen, selenium (Se), sulfur (S), and tellurium (Te); or a III–V compound semiconductor containing at least one kind of group III elements selected from a group consisting of boron, aluminum, gallium, and indium, and at least one kind of group V elements selected from a group consisting of nitrogen, phosphorous (P), arsenic (As), antimony (Ab), and bismuth (Bi).

In the embodiments, nearly one layer of the microcrystals is formed in the stacking direction to form the light emitting layer; however, two or more layers of the microcrystals may be stacked.

In the first to fifth, eleventh, and fifteenth to nineteenth embodiments of the light emitting device, the conductive type of the first conductive type cladding layer is taken as the n-type, and the conductive type of the second conductive type cladding layer is taken as the p-type; however, the conductive type of the first conductive type cladding layer may be taken as the p-type, and the conductive type of the second conductive type cladding layer be taken as the n-type. In the sixth to tenth, and twelfth to fourteenth embodiments of the light emitting device, the conductive type of the first conductive type cladding layer is taken as the p-type, and the conductive type of the second conductive type cladding layer is taken as the n-type; however, the conductive type of the first conductive type cladding layer may be taken as the n-type, and the conductive type of the second conductive type cladding layer be taken as the p-type.

In the first to fifth, eleventh, and fifteenth to nineteenth embodiments of the light emitting device, each of the first conductive type cladding layer and the second conductive type cladding layer is made from a non-single crystal body of an inorganic semiconductor; however, either the first conductive type cladding layer or the second conductive type cladding layer may be made from a non-single crystal body of an inorganic semiconductor. Alternatively, each of the first conductive type cladding layer and the second conductive type cladding layer may be made from a single crystal body of an inorganic semiconductor.

In the sixth to tenth and twelfth to fourteenth embodiments of the light emitting device, each of the first conductive type cladding layer and the second conductive type cladding layer is made from an organic semiconductor or conductive resin; however, either the first conductive type cladding layer or the second conductive type cladding layer may be made from an organic semiconductor or conductive resin. Alternatively, one of the first conductive type cladding layer may be made from an organic semiconductor and the other be made from a conductive resin. In the case where each of the first conductive type cladding layer and the second conductive type cladding layer is made from an organic semiconductor, both the cladding layers may be made from the same organic semiconductor or different organic semiconductors.

In the twelfth to fourteenth embodiments, at least one of the first conductive type cladding layer and the second conductive type cladding layer has a multi-layer structure including layers made from organic semiconductors; however, at least one layer of the multi-layer structure may be made from a conductive resin.

In the eleventh to thirteenth embodiments, each of the first conductive type cladding layer and the second conductive type cladding layer has a multi-layer structure; however, either the first conductive type cladding layer or the second conductive type cladding layer may have a multi-layer structure.

In the eleventh to fourteenth embodiments of the light emitting device, the first conductive type cladding layer or the second conductive type cladding layer has a double-layer structure; however, the cladding layer may have a multi-layer structure including three or more layers. In this case, by setting the band gap of the cladding layer such that the band gap is smaller at a portion nearer to the light emitting layer, it is possible to enhance the emission efficiency, like the eleventh and twelfth embodiments. Further, the above cladding layer may include at least one of the adhesive layer and the electrode layer, in addition to the plurality of layers stacked such that the band gap becomes smaller at a portion nearer to the light emitting layer.

In the thirteenth or fourteenth embodiment of the light emitting device, the adhesive layer or the electrode layer is formed on the second conductive type cladding layer; however, the adhesive layer or the electrode layer may be provided on the first conductive type cladding layer.

In the above-described embodiments, the insulating layer is formed between the first conductive type cladding layer and the second conductive type cladding layer; however, it may be omitted if there occurs no problem associated with leakage current between the first conductive type cladding layer and the second conductive type cladding layer.

In the first embodiment of the light emitting device, the light emitting layer is formed by coating the first conductive type cladding layer with a plurality of the micro-crystals dispersed in a solvent. In this case, by using, as the solvent, a material forming an insulating film after burning, such as SOG (Spin On Glass), it is possible to easily form the insulating layer.

In the eighteenth embodiment of the light emitting device and the second to fifth embodiment of the display unit, the phosphor layer is provided on the second conductive type cladding layer; however, it may be disposed at another point insofar as it is irradiated with light emitted from the light emitting layer. For example, the phosphor layer may be separated from the second conductive type cladding layer or the like, and supported by a separate holder.

In the first embodiment of the light emitting apparatus and the first to seventh embodiments of the display unit, the present invention is applied to the case of generating light emission of a plurality of colors; however, the present invention can be applied to the case of generating light emission of single color.

In the first to seventh embodiments of the display unit, the light emitting diodes of the present invention are disposed in an array; however, the light emitting diodes of the present invention may be partially used for the display unit. That is to say, the display unit of the present invention may include at least one light emitting diode of the present invention and other light emitting diodes each having a configuration different from that of the light emitting diode of the present invention.

In the first embodiment of the light emitting apparatus and the first to seventh embodiments of the display unit, the configuration of the light emitting diode is concretely described; however, any light emitting device, having a different configuration, of the present invention described in the other embodiments can be used. Even in this case, the same effect can be obtained.

In the first to seventh embodiments of the display unit, all of the light emitting devices are disposed on a common substrate, or each row or each column of the light emitting devices are disposed on a common substrate; however, the light emitting devices may be independently disposed on substrates, and the substrates be mounted on a mounting substrate.

What is claimed is:

1. A light emitting device comprising:
   a first conductive type layer;
   a second conductive type layer; and
   a micro-crystal layer containing two or more kinds of semiconductor mico-cystals, said micro-crystal layer being formed between said first conductive type layer and said second conductive type layer.

2. A light emitting device according to claim 1, wherein each of said first conductive type layer and said second conductive type layer is made from an inorganic semiconductor containing nitrogen, and said micro-crystal layer is made from an inorganic semiconductor containing oxygen.

3. A light emitting device according to claim 1, wherein each of said first conductive type layer, said second conductive type layer, and said micro-crystal layer is made from an inorganic semiconductor containing nitrogen.

4. A light emitting device according to claim 1, wherein each of said first conductive type layer and said second conductive type layer is made from an inorganic semiconductor containing oxygen, and said micro-crystal layer is made from an inorganic semiconductor containing nitrogen.

5. A light emitting device according to claim 1, wherein at least one of said first conductive type layer and said second conductive type layer is made from at least one of an organic semiconductor and a conductive resin.

6. A light emitting device according to claim 5, wherein said organic semiconductor is at least one kind of a $\pi$ conjugated high polymer complex, a high polymer silicon derivative, and a high polymer metal complex.

7. A light emitting device according to claim 1, wherein at least one of said first conductive type layer and said second conductive type layer has a multi-layer structure.

8. A light emitting device according to claim 7, wherein at least one of said first conductive type layer and said second conductive type layer has a plurality of layers which are stacked in such a manner that a band gap of said conductive type layer becomes smaller at a portion nearer to said micro-crystal layer.

9. A light emitting device according to claim 7, further comprising an electrode provided on at least one of said first conductive type layer and said second conductive type layer, wherein said at least one of said first conductive type layer and said second conductive type layer on which said electrode is disposed has, in said multi-layer structure, an adhesive layer for enhancing the adhesiveness of said electrode.

10. A light emitting device according to claim 7, wherein at least one of said first conductive type layer and said second conductive type layer has, in said multi-layer structure, an electrode layer functioning as an electrode.

11. A light emitting device according to claim 1, further comprising an insulating layer for preventing the contact between said first conductive type layer and said second conductive type layer, said insulating layer being formed in spaces between said micro-crystals of said micro-crystal layer.

12. A light emitting device according to claim 11, wherein each of said first conductive type layer and said second conductive type layer is made from an inorganic semiconductor containing nitrogen, and said insulating layer is made from an inorganic semiconductor containing oxygen.

13. A light emitting device according to claim 11, wherein each of said first conductive type layer and said second conductive type layer is made from an inorganic semiconductor containing oxygen, and said insulating layer is made from an inorganic semiconductor containing nitrogen.

14. A light emitting device according to claim 1, further comprising a phosphor layer.

15. A light emitting device according to claim 1, further comprising a pair of reflectors forming a resonator.

16. A display unit comprising:
    at least one light emitting device including a first conductive type layer, a second conductive type layer, and a micro-crystal layer containing two or more kinds of semiconductor micro-crystals, said micro-crystal layer being formed between said first conductive type layer and said second conductive type layer.

* * * * *